(12) United States Patent
Ueno et al.

(10) Patent No.: US 12,525,490 B2
(45) Date of Patent: Jan. 13, 2026

(54) HEAT TREATMENT APPARATUS AND HEAT TREATMENT METHOD

(71) Applicant: SCREEN Holdings Co., Ltd., Kyoto (JP)

(72) Inventors: Tomohiro Ueno, Kyoto (JP); Hiroshi Miyake, Kyoto (JP)

(73) Assignee: SCREEN Holding Co., Ltd., Kyoto (JP)

( * ) Notice: Subject to any disclaimer, the term of this patent is extended or adjusted under 35 U.S.C. 154(b) by 502 days.

(21) Appl. No.: 17/835,340

(22) Filed: Jun. 8, 2022

(65) Prior Publication Data
US 2023/0087029 A1    Mar. 23, 2023

(30) Foreign Application Priority Data
Sep. 17, 2021    (JP) ................................ 2021-151806

(51) Int. Cl.
*H01L 21/66*    (2006.01)
*H01L 21/324*    (2006.01)
*H01L 21/67*    (2006.01)

(52) U.S. Cl.
CPC ............ *H01L 22/12* (2013.01); *H01L 21/324* (2013.01); *H01L 21/67115* (2013.01)

(58) Field of Classification Search
CPC .......................... H01L 21/324; H01L 21/67115
See application file for complete search history.

(56) References Cited

U.S. PATENT DOCUMENTS

| | | |
|---|---|---|
| 2002/0127852 A1 | 9/2002 | Kawakami et al. |
| 2007/0035322 A1 | 2/2007 | Kang et al. |
| 2017/0125312 A1 | 5/2017 | Ono |
| 2019/0013224 A1 | 1/2019 | Chiba et al. |
| 2019/0139804 A1* | 5/2019 | Takao ............... H01L 21/67265 |
| 2020/0090949 A1 | 3/2020 | Ueno et al. |
| 2020/0098601 A1 | 3/2020 | Ueno et al. |

FOREIGN PATENT DOCUMENTS

| | | |
|---|---|---|
| CN | 109216237 A | 1/2019 |
| CN | 110896030 A | 3/2020 |
| CN | 110931357 A | 3/2020 |
| JP | 2002-261146 A | 9/2002 |
| JP | 2003-344304 A | 12/2003 |

(Continued)

OTHER PUBLICATIONS

Request for the Submission of an Opinion dated Jun. 12, 2024 in corresponding Korean Patent Application No. 10-2022-0102561 and a English machine language translation obtained from the Global Dossier.

(Continued)

*Primary Examiner* — Walter H Swanson
(74) *Attorney, Agent, or Firm* — OSTROLENK FABER LLP

(57) ABSTRACT

A heat treatment apparatus is a heat treatment apparatus managing a dummy wafer. The heat treatment apparatus includes: a heat treatment part performing a heat treatment on the dummy wafer; a damage detection part detecting a damage of the dummy wafer; and a controller determining whether or not the dummy wafer can be used based on damage information detected by the damage detection part.

3 Claims, 13 Drawing Sheets

(56) References Cited

FOREIGN PATENT DOCUMENTS

| | | |
|---|---|---|
| JP | 2007-049126 A | 2/2007 |
| JP | 2012-109333 A | 6/2012 |
| JP | 2015-195328 A | 11/2015 |
| JP | 2017-092102 A | 5/2017 |
| JP | 2019-016662 A | 1/2019 |
| JP | 2020-043288 A | 3/2020 |
| JP | 2020-088057 A | 6/2020 |
| KR | 19990023090 U | 7/1999 |
| KR | 10-2019-0005113 A | 1/2019 |
| WO | WO 2020/105449 A1 | 5/2020 |

OTHER PUBLICATIONS

Notice of Final Rejection dated Feb. 28, 2025 in corresponding Korean Patent Application No. 10-2022-0102561 and a computer generated English translation obtained from the JPO.

Notice of Reasons for Refusal dated Apr. 30, 2025 in corresponding Japanese Patent Application No. 2021-151806 and a computer generated English translation obtained from the JPO.

First Office Action with Search Report dated May 23, 2025 in corresponding Chinese Patent Application No. 202211003994.3 and a computer generated English language translation obtained from the Global Dossier.

\* cited by examiner

FIG. 12
FIG. 13
FIG. 14
| WAFER | HEATING TIME | NUMBER OF HEATING TREATMENTS | WARPAGE | DAMAGE |
|---|---|---|---|---|
| Slot1 | ○ | ○ | ○ | ○ |
| Slot2 | ○ | ○ | ○ | × |
| ... | ... | ... | ... | ... |
| ... | ... | ... | ... | ... |
| ... | ... | ... | ... | ... |
| ... | ... | ... | ... | ... |
| ... | ... | ... | ... | ... |
| ... | ... | ... | ... | ... |
| ... | ... | ... | ... | ... |
| ... | ... | ... | ... | ... |

HEAT TREATMENT APPARATUS AND HEAT TREATMENT METHOD

BACKGROUND OF THE INVENTION

Field of the Invention

The present invention relates to a heat treatment method and a heat treatment apparatus managing a dummy wafer.

Description of the Background Art

A flash lamp anneal (FLA) which heats a semiconductor wafer for an extremely short time in a process of manufacturing a semiconductor device attracts attention. The flash lamp anneal is a heat treatment technique of irradiating a surface of a semiconductor wafer with a flash of light using a xenon flash lamp (a simple term of "a flash lamp" means a xenon flash lamp hereinafter), thereby increasing a temperature of only the surface of the semiconductor wafer in an extremely short time (several milliseconds or less).

A radiation spectral distribution of the xenon flash lamp ranges from an ultraviolet region to a near-infrared region, thus a wavelength of the xenon flash lamp is shorter than that of a conventional halogen lamp, and almost coincides with a basic absorption band of a silicon semiconductor wafer. Thus, when the semiconductor wafer is irradiated with a flash of light emitted from the xenon flash lamp, the temperature of the semiconductor wafer can be rapidly increased with less transmitted light. It is also known that a flash irradiation for the extremely short time of several milliseconds or less can selectively increase a temperature of only a region near the surface of the semiconductor wafer.

Such a flash lamp anneal is used for processing requiring a heating for an extremely short time, for example, typically an activation of impurity implanted into the semiconductor wafer. When the surface of the semiconductor wafer into which the impurity is implanted by an ion implantation method is irradiated with a flash of light from the flash lamp, the surface of the semiconductor wafer can be increased to an activation temperature only for the extremely short time, thus only an impurity activation can be executed without deeply diffusing the impurity.

Not only the heat treatment but also any processing of a semiconductor wafer is typically performed in a unit of lot (one group of semiconductor wafer subjected to the same processing under the same condition). In a sheet-fed type substrate processing device, the processing is continuously performed in series on a plurality of semiconductor wafers constituting a lot. Also in a flash lamp annealer, a plurality of semiconductor wafers constituting a lot are transported into a chamber one by one and a heat treatment is performed in series.

However, a temperature of an in-chamber structure such as a susceptor holding the semiconductor wafer changes in some cases in a process of processing the plurality of semiconductor wafers constituting the lot in series. Such a phenomenon occurs in a case where processing is newly started in a flash lamp annealer which has been a non-operation state for a while or a case where a processing condition such as a processing temperature of a semiconductor wafer is changed. When the temperature of the in-chamber structure such as the susceptor changes in the process of processing the plurality of semiconductor wafers in the lot, there is a problem that a temperature history in the processing differs between the semiconductor wafer early in the lot and the late semiconductor wafer.

Performed to solve such a problem is that a dummy wafer which is not to be processed is transported into a chamber and held by a susceptor before processing of a lot is started, and a flash heat treatment is performed in the same conditions as that of the lot to be processed to increase a temperature of an in-chamber structure such as a susceptor in advance (dummy running). Japanese Patent Application Laid-Open No. 2017-92102 discloses that a flash heat treatment is performed on around ten dummy wafers to make a temperature of an in-chamber structure such as a susceptor reach a stable temperature in processing.

The dummy wafer which is not to be processed is used for a plural times of dummy running, thus is subject to the heating treatment repeatedly. As a result, deterioration of the dummy wafer proceeds, and breakage or warpage of the wafer caused by the deterioration easily occurs. Occurrence of breakage or warpage of the dummy wafer at a time of dummy running causes contamination in a chamber or a trouble in transportation. Thus, there is a need to accurately grasp a deterioration state of the dummy wafer and replace the dummy wafer in which deterioration has proceeded at an appropriate timing. However, an operator conventionally performs a visual management or writes down on a piece of paper to manage a processing history of the dummy wafer, thus cannot sufficiently grasp the deterioration state, thus there is a problem that a dummy wafer in which deterioration has excessively proceeded are erroneously transported and a heating treatment is performed.

With regard to the other apparatus managing such a dummy wafer, Japanese Patent Application Laid-Open No. 2020-43288 discloses an apparatus holding dummy database associating a processing history of each of a plurality of dummy wafers with a carrier housing the dummy wafers in a storage part.

A preheat treatment or a flash heat treatment are repeatedly performed on the dummy wafer described in Japanese Patent Application Laid-Open No. 2020-43288. Thus, a damage or warpage easily occurs in the dummy wafer. Occurrence of warpage in the dummy wafer causes a failure in transportation by a transportation apparatus. Occurrence of a damage in the dummy wafer causes breakage of the dummy wafer. A state of warpage or the damage of the dummy wafer differs depending on conditions of heating. Thus, a failure in transportation of the dummy wafer caused by the warpage of the dummy wafer or breakage of the dummy wafer caused by the damage of the dummy wafer is hardly prevented only by managing a heating time and the number of heating treatments with the processing history.

SUMMARY OF THE INVENTION

The present invention is directed to a heat treatment apparatus managing a dummy wafer.

According to one aspect of the present invention, the heat treatment apparatus managing a dummy wafer includes: a heat treatment part performing a heat treatment on the dummy wafer; a damage detection part detecting a damage of the dummy wafer; and a controller determining whether or not the dummy wafer can be used based on damage information detected by the damage detection part.

It is determined whether or not the dummy wafer can be used based on the detected damage information, thus deterioration of the dummy wafer can be precisely managed.

According to another one aspect of the present invention, a heat treatment apparatus managing a dummy wafer includes: a heat treatment part performing a heat treatment on the dummy wafer; a warpage detection part detecting warpage of the dummy wafer; and a controller determining whether or not the dummy wafer can be used based on warpage information detected by the warpage detection part.

It is determined whether or not the dummy wafer can be used based on the detected warpage information, thus deterioration of the dummy wafer can be precisely managed.

According to another one aspect of the present invention, a heat treatment apparatus managing a dummy wafer includes: a heat treatment part performing a heat treatment on the dummy wafer; a damage detection part detecting a damage of the dummy wafer; a warpage detection part detecting warpage of the dummy wafer; and a controller determining whether or not the dummy wafer can be used based on damage information detected by the damage detection part and warpage information detected by the warpage detection part.

It is determined whether or not the dummy wafer can be used based on the detected damage information and the detected warpage information, thus deterioration of the dummy wafer can be precisely managed.

The present invention is directed to a heat treatment method managing a dummy wafer.

According to one aspect of the present invention, a heat treatment method for managing a dummy wafer includes: (a) a heat treatment step of performing a heat treatment on the dummy wafer; (b) a damage detection step of detecting a damage of the dummy wafer; and (c) a determination step of determining whether or not the dummy wafer can be used based on damage information detected by the damage detection step.

It is determined whether or not the dummy wafer can be used based on the detected damage information, thus deterioration of the dummy wafer can be precisely managed.

According to another one aspect of the present invention, a heat treatment method for managing a dummy wafer includes: (a) a heat treatment step of performing a heat treatment on the dummy wafer; (d) a warpage detection step of detecting warpage of the dummy wafer; and (e) a determination step of determining whether or not the dummy wafer can be used based on warpage information detected by the warpage detection step.

It is determined whether or not the dummy wafer can be used based on the detected warpage information, thus deterioration of the dummy wafer can be precisely managed.

According to another one aspect of the present invention, a heat treatment method for managing a dummy wafer includes: (a) a heat treatment step of performing a heat treatment on the dummy wafer; (b) a damage detection step of detecting a damage of the dummy wafer; (d) a warpage detection step of detecting warpage of the dummy wafer; and (f) a determination step of determining whether or not the dummy wafer can be used based on damage information detected by the damage detection step and warpage information detected by the warpage detection step.

It is determined whether or not the dummy wafer can be used based on the detected damage information and the detected warpage information, thus deterioration of the dummy wafer can be precisely managed.

Accordingly, an object of the present invention is to precisely manage deterioration of the dummy wafer.

These and other objects, features, aspects and advantages of the present invention will become more apparent from the following detailed description of the present invention when taken in conjunction with the accompanying drawings.

BRIEF DESCRIPTION OF THE DRAWING

FIG. 12 is a schematic view of a side cross section indicating a width of warpage of a wafer.

FIG. 13 is a schematic view of a side cross section indicating a width of warpage of a wafer.

FIG. 14 is a screen displayed on a display part.

DESCRIPTION OF THE PREFERRED EMBODIMENTS

Embodiments according to the present invention will now be described in detail with reference to the drawings.

First Embodiment

Figure 1:
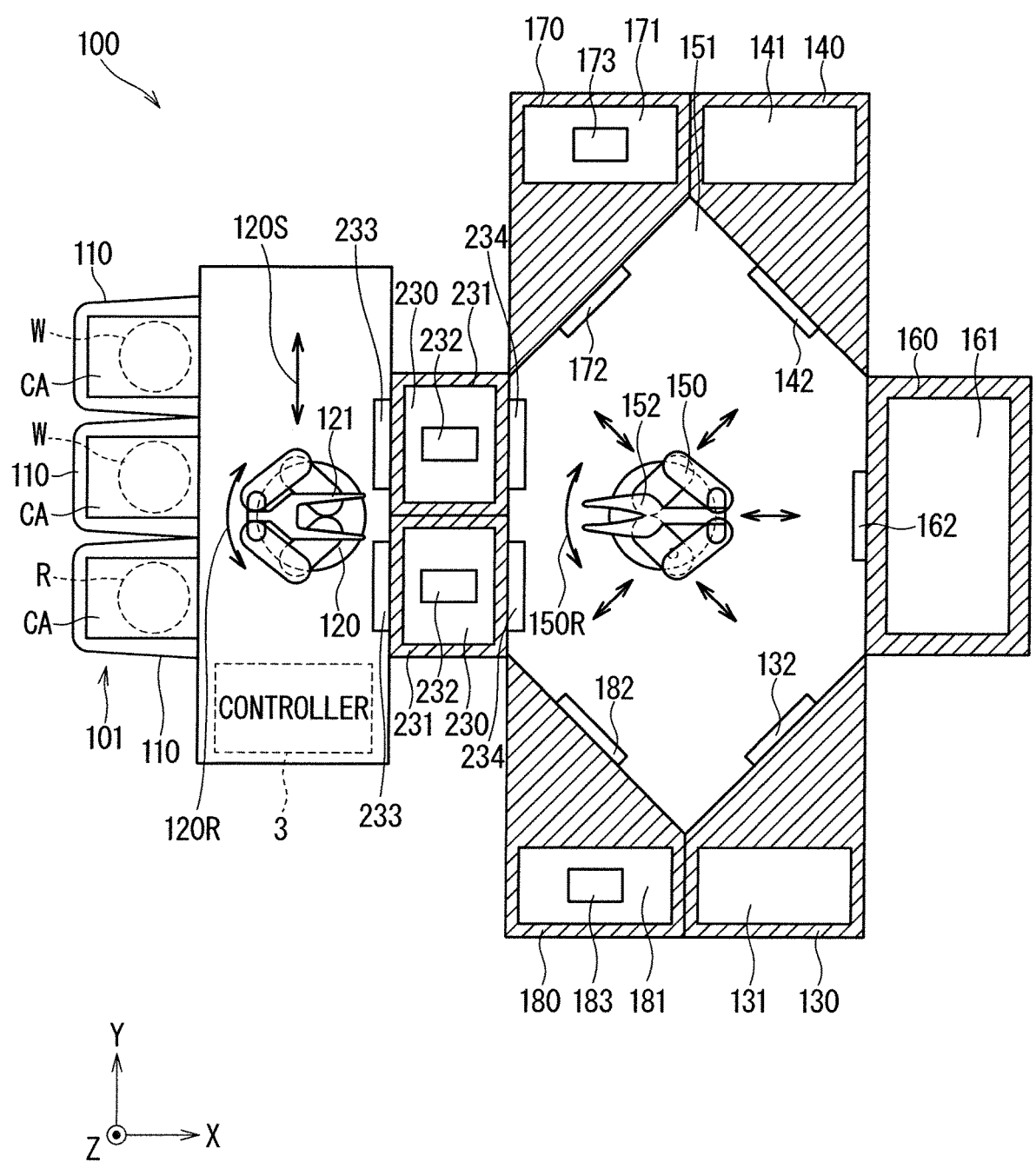
FIG. 1 is a plan view showing a heat treatment apparatus according to the present invention.

Firstly, a heat treatment apparatus according to the present invention will be described. FIG. 1 is a plan view showing a heat treatment apparatus 100 according to the present invention. The heat treatment apparatus 100 is a flash lamp annealer for heating a disk-shaped semiconductor wafer W serving as a substrate by irradiating the semiconductor wafer W with a flash of light. A size of the semiconductor wafer W to be processed is not particularly limited. For example, the semiconductor wafer W to be processed has a diameter of 300 mm or 450 mm. The semiconductor wafer W prior to the transport into the heat treatment apparatus 100 is implanted with impurities. The heat treatment apparatus 100 performs a heating treatment on the semiconductor wafer W to thereby activate the impurities implanted in the semiconductor wafer W. It should be noted that dimensions of components and the number of components are illustrated in exaggeration or in simplified form, as appropriate, in FIG. 1 and the subsequent drawings for the sake of easier understanding. FIG. 1 shows an XYZ orthogonal coordinate system whose Z axis direction is a vertical direction and whose XY plane is a horizontal plane to clarify a direction relationship between the drawings.

As shown in FIG. 1, the heat treatment apparatus 100 includes an indexer 101 transporting a untreated semiconductor wafer W (or a dummy wafer R) from an outer side into the apparatus and transporting the treated semiconductor wafer W (or a dummy wafer R) to an outer side of the apparatus, an alignment part 230 positioning the untreated semiconductor wafer W, two cooling parts 130 and 140 cooling the semiconductor wafer W after a heating treatment, a heat treatment part 160 performing a flash heat treatment on the semiconductor wafer W (or the dummy wafer R), a transport robot 150 transferring the semiconductor wafer W (or the dummy wafer R) to and from the cooling parts 130 and 140 and the heat treatment part 160, a damage detection part 170 detecting a damage of the semiconductor wafer W (or the dummy wafer R), and a film thickness detection part 180 detecting a film thickness of the semiconductor wafer W. The heat treatment apparatus 100 includes a controller 3 for controlling an operation mechanism provided in each of the above treatment parts and the transport robot 150 to proceed with the flash heat treatment of the semiconductor wafer W (or the dummy wafer R).

The indexer 101 includes a load port 110 for aligning and placing a plurality of (in the present embodiment, three) carriers CA, and a transfer robot 120 for taking out the untreated semiconductor wafer W (or the dummy wafer R) from each carrier CA and housing the treated semiconductor wafer W (or the dummy wafer R) in each carrier CA. The carrier CA having received the untreated semiconductor wafer W (or the dummy wafer R) is transported by an unmanned transport vehicle (an AGV or an OHT), for example, and is placed on the load port 110. The carrier CA having received the treated semiconductor wafer W (or the dummy wafer R) is carried away from the load port by the unmanned transport vehicle.

In the load port 110, the carrier CA can go up and down so that the transfer robot 120 can take the optional semiconductor wafer W (or the dummy wafer R) in and out of the carrier CA. Applicable as a form of the carrier CA is a front opening unified pod (FOUP) housing the semiconductor wafer W in an enclosed space, a standard mechanical interface (SMIF) pod, or an open cassette (OC) exposing the semiconductor wafer W to outside air.

Further, the transfer robot 120 can perform slide movement indicated by an arrow 120S in FIG. 1, and a turning operation indicated by an arrow 120R and an upward/downward movement operation. Accordingly, the transfer robot 120 takes the semiconductor wafer W or the dummy wafer R in and out of the three carriers CA, and transfers the semiconductor wafer W or the dummy wafer R to and from two the alignment parts 230 The transfer robot 120 takes the semiconductor wafer W (or the dummy wafer R) in and out of the carrier CA by slide movement of a hand 121 and upward/downward movement of the carrier CA. The transfer robot 120 transfers the semiconductor wafer W to and from the alignment part 230 by the slide movement of the hand 121 and the upward/downward movement operation of the transfer robot 120.

Two alignment parts 230 are provided to be arranged in an X direction between the transfer robot 120 in the indexer 101 and the transport robot 150. Each alignment part 230 is a treatment part for rotating the semiconductor wafer W in a horizontal plane, and directing the semiconductor wafer W in a direction suitable for flash heating. The alignment part 230 includes, inside an alignment chamber 231 that is an enclosure made of an aluminum alloy, a mechanism for supporting the semiconductor wafer W in a horizontal attitude and rotating the semiconductor wafer W, and a mechanism (not shown in the drawings) for optically detecting, for example, a notch or an orientation flat formed at a peripheral edge portion of the semiconductor wafer W. The alignment part 230 includes a warpage detection mechanism 232 detecting warpage of the semiconductor wafer W (or the dummy wafer R). The warpage detection mechanism 232 detects warpage of the semiconductor wafer W (or the dummy wafer R) using a known optical sensor technique. The alignment part 230 includes the warpage detection mechanism 232, thereby being able to detect warpage of the semiconductor wafer W (or the dummy wafer R) while correcting a direction of the semiconductor wafer W (or the dummy wafer R).

The semiconductor wafer W (or the dummy wafer R) is transferred to and from the two alignment parts 230 by the transfer robot 120. The semiconductor wafer W (or the dummy wafer R) is transferred from the transfer robot 120 to each alignment chamber 231 so that a center of the wafer is located in a predetermined position. In each alignment part 230, the semiconductor wafer W (or the dummy wafer R) is rotated around an axis, in a vertical direction, centering on a center portion of the semiconductor wafer W (or the dummy wafer R) transferred from the indexer 101, and a notch, for example, is optically detected to adjust a direction of the semiconductor wafer W (or the dummy wafer R). The semiconductor wafer W (or the dummy wafer R) in which the direction adjustment has been finished is taken out of the alignment chamber 231 by the transfer robot 150 (described hereinafter). Information of warpage of the semiconductor wafer W (or the dummy wafer R) detected in the alignment part 230 is stored in the controller 3.

As a transport space of the semiconductor wafer W (or the dummy wafer R) in the transport robot 150, a transport chamber 151 for housing the transport robot 150 is provided. The alignment part 230 is connected to both the index 101 and the transport chamber 151 therebetween. An opening for transporting the semiconductor wafer W into and from the indexer 101 is formed in each alignment part 230. Each opening can be opened and closed by a gate valve 233. In the similar manner, an opening for transporting the semiconductor wafer W (or the dummy wafer R) into and from the transport chamber 151 is formed in each alignment part 230. Each opening can also be opened and closed by a gate valve 234. That is to say, the indexer 101 and the alignment part 230 are connected via the gate valve 233, and the transport chamber 151 and the alignment part 230 are connected via the gate valve 234.

When the semiconductor wafer W (or the dummy wafer R) is transferred between the indexer 101 and the alignment part 230, the gate valve 233 is opened. When the semiconductor wafer W (or the dummy wafer R) is transferred between the alignment part 230 and the transport chamber 151, the gate valve 234 is opened. When the gate valve 233 and the gate valve 234 are closed, an inner portion of the alignment part 230 is an enclosed space.

A heat treatment chamber 161 of the heat treatment part 160, a first cooling chamber 131 of the cooling part 130, a second cooling chamber 141 of the cooling part 140, a damage detection chamber 171 of the damage detection part 170, and a film thickness detection chamber 181 of the film thickness detection part 180 are communicably connected around the transport chamber 151. Formed in the transport chamber 151 are an opening for transporting the semiconductor wafer W (or the dummy wafer R) to and from the heat treatment chamber 161, an opening for transporting the semiconductor wafer W (or the dummy wafer R) to and from the first cooling chamber 131 and the second cooling chamber 141, an opening for transporting the semiconductor wafer W (or the dummy wafer R) to and from the damage detection chamber 171, and an opening for transporting the semiconductor wafer W (or the dummy wafer R) to and from the film thickness detection chamber 181. These opening are also opened and closed by the gate valves 162, 132, 142, 172, and 182, respectively.

That is to say, the heat treatment chamber 161 and the transport chamber 151 are connected via the gate valve 162, the first cooling chamber 131 and the transport chamber 151 are connected via the gate valve 132, the second cooling chamber 141 and the transport chamber 151 are connected via the gate valve 142, the damage detection chamber 171 and the transport chamber 151 are connected via the gate valve 172, and the film thickness detection chamber 181 and the transport chamber 151 are connected via the gate valve 182.

The transport robot 150 provided in the transport chamber 151 is turnable about an axis along the vertical direction as indicated by an arrow 150R. The transport robot 150 includes two linkage mechanisms made up of a plurality of arm segments, and two transport hands 152 each holding the semiconductor wafer W (or the dummy wafer R) are provided in a tip end of the two linkage mechanisms. These two transport hands 152 are disposed vertically spaced a predetermined pitch apart from each other, and are linearly slidable by the linkage mechanisms in the same horizontal direction independently from each other. The transport robot 150 moves upwardly and downwardly a base provided with the two linkage mechanisms to move the two transport hands 152 upwardly and downwardly in a state where the two transport hands 152 are spaced the predetermined pitch apart.

When the transport robot 150 transfers (takes in and out) the semiconductor wafer W (or the dummy wafer R) to and from the alignment chamber 231, the damage detection chamber 171, the film thickness chamber 181, the first cooling chamber 131, the second cooling chamber 141, or the heat treatment chamber 161 as a transfer party, the transport hands 152 are firstly pivoted to face the transfer party, and subsequently (or during pivot), the transport hands 152 moves upwardly and downwardly to be located in a height at which any of the transport hands 152 transfers the semiconductor wafer W to and from the transfer party. Then, the transport hands 152 are linearly slid and moved in the horizontal direction to transfer the semiconductor wafer W (or the dummy wafer R) to or from the transfer party.

The transfer of the semiconductor wafer W (or the dummy wafer R) between the transport robot 150 and the transfer robot 120 can be performed via the alignment part 230. That is to say, the alignment chamber 231 of the alignment part 230 also functions as a path for transferring the semiconductor wafer W (or the dummy wafer R) between the transport robot 150 and the transfer robot 120. Specifically, the semiconductor wafer W (or the dummy wafer R) transferred from one of the transport robot 150 and the transfer robot 120 to the alignment chamber 231 is transferred to the other one thereof, thus the semiconductor wafer W (or the dummy wafer R) are transferred. The transport robot 150 and the transfer robot 120 constitute a transport mechanism of transporting the semiconductor wafer W (or the dummy wafer R) from the carrier CA to each chamber (the damage detection chamber 171, the film thickness detection chamber 181, the first cooling chamber 131, the second cooling chamber 141, and the heat treatment chamber 161).

The damage detection part 170 detects a damage in a surface of the semiconductor wafer W (or the dummy wafer R). The damage detection chamber 171 of the damage detection part 170 includes an imaging unit as a damage detection device 173. The damage detection device 173 is a known imaging apparatus, for example, and includes an inspection camera or an inspection lighting part, for example. The damage detection device 173 takes an image of a damage formed in the semiconductor wafer W (or the dummy wafer R) transported to the damage detection part 170 from a +Z direction (from an upper side), for example, thereby detecting the damage in the semiconductor wafer W (or the dummy wafer R).

A storage part 34 stores image data of the semiconductor wafer W (or the dummy wafer R), for example. The controller 3 is connected each part (for example, an inspection camera, an inspection lighting part, or a sensor, for example) of the damage detection part 170 to control an operation thereof. The controller 3 also performs various calculations. The calculations are calculations for comparing image data of an image taken by an inspection camera with reference image data to detect the damage of the semiconductor wafer W (or the dummy wafer R). The calculations are performed by binarizing the image data which has been taken in the controller 3, for example. The image processing described above is performed on the image of the semiconductor wafer W (or the dummy wafer R) which has been taken, thus the damage occurring in the semiconductor wafer W (or the dummy wafer R) is detected.

The film thickness detection part 180 detects a thickness of a thin film formed on the surface of the semiconductor wafer W (or the dummy wafer R). The film thickness detection chamber 181 of the film thickness detection part 180 includes a film thickness sensor 183 as a known film thickness detection apparatus, for example. The film thickness sensor 183 is a sensor measuring a thickness of a film formed on the semiconductor wafer W (or the dummy wafer R) or a thickness of the semiconductor wafer W (or the dummy wafer R) itself. The film thickness sensor may be an optical sensor or the other known sensor, for example.

The two cooling parts 130 and 140 include the substantially same configuration. Each of the cooling parts 130 and 140 includes a metal cooling plate inside the first cooling chamber 131 and the second cooling chamber 141, each of which is an enclosure made of an aluminum alloy, and a quartz plate placed on an upper surface of the cooling plate (neither of the cooling plate and the quartz plate is shown). A temperature of the cooling plate is adjusted to a normal temperature (approximately 23° C.) by a Peltier element or constant temperature water circulation. When the semiconductor wafer W on which a heating treatment has been performed in the heat treatment part 160 is transported into the first cooling chamber 131 or the second cooling chamber 141, the semiconductor wafer W is placed on the quartz plate and cooled.

When the semiconductor wafer W (or the dummy wafer R) is transferred between the transport chamber 151 and each chamber (the damage detection chamber 171, the film thickness detection chamber 181, the first cooling chamber 131, the second cooling chamber 141, and the heat treatment chamber 161), the gate valves 132, 142, 162, 172, and 182 corresponding to the chambers, respectively, are opened. When the gate valves 132, 142, 162, 172, and 182 corresponding to the chambers, respectively, are closed, inner portions of the corresponding chambers (the damage detection chamber 171, the film thickness detection chamber 181, the first cooling chamber 131, the second cooling chamber 141, and the heat treatment chamber 161) are enclosed spaces. For example, when the gate valve 132 corresponding to the first cooling chamber 131 is closed, the first cooling chamber 131 is an enclosed space. When the semiconductor wafer W is transported in the heat treatment apparatus 100, these gate valves are opened and closed as appropriate.

Furthermore, each of the cooling parts 130 and 140 is provided with a gas supply mechanism for supplying clean nitrogen gas into the first cooling chamber 131 and the second cooling chamber 141, and an exhaust mechanism for exhausting atmosphere in the chambers. The gas supply mechanism and the exhaust mechanism may be able to switch a flow rate in two levels. In the similar manner, nitrogen gas is also supplied into the transport chamber 151, the heat treatment chamber 161, the damage detection chamber 171, the film thickness detection chamber 181, and the alignment chamber 231, from the gas supply part, and atmospheres therein are exhausted by an exhaust part (neither of the gas supply part and the exhaust part is shown).

Figure 2:
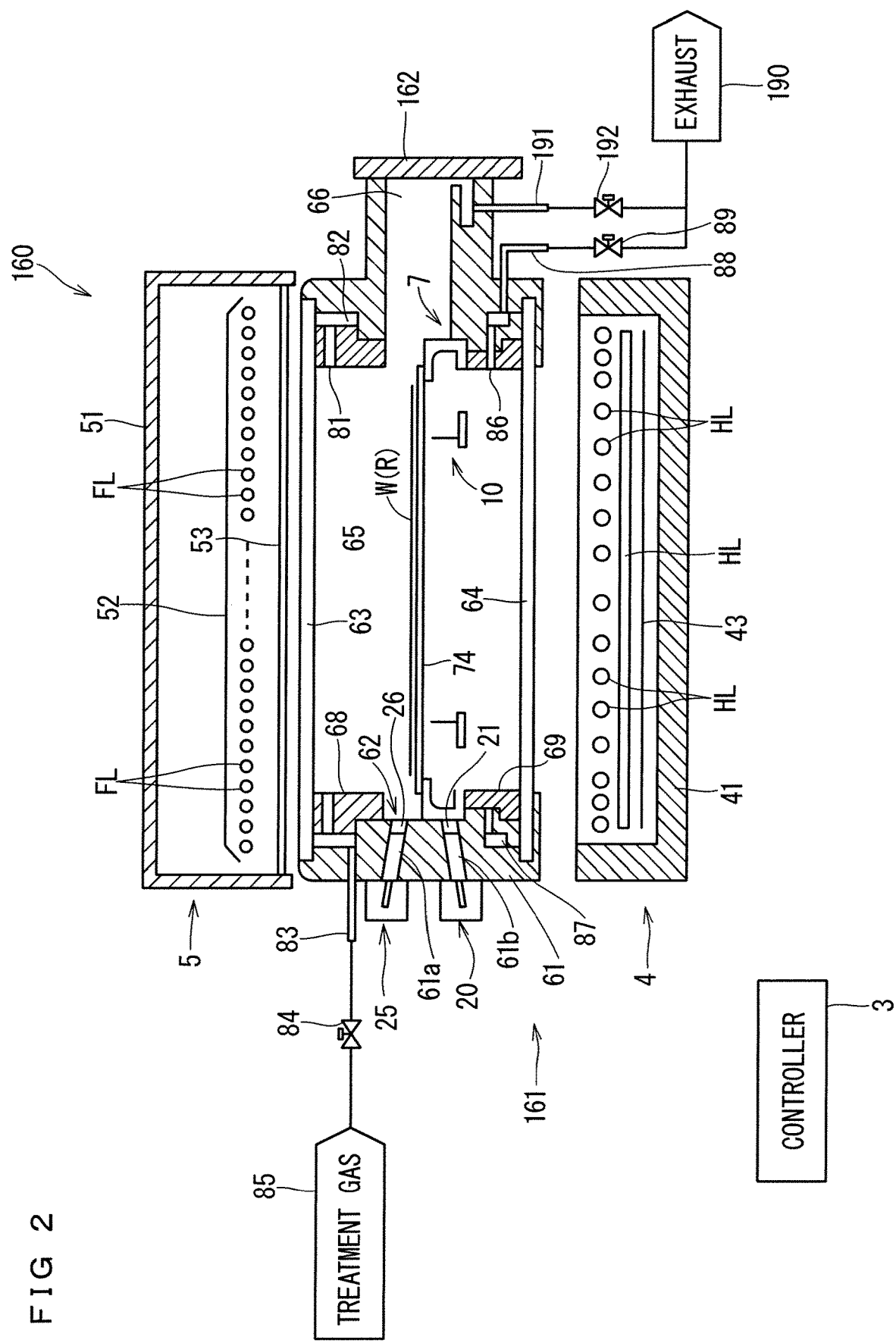
FIG. 2 is a longitudinal cross-sectional view showing a configuration of a heat treatment part.

Next, a configuration of the heat treatment part 160 will be described. FIG. 2 is a longitudinal cross-sectional view showing a configuration of the heat treatment part 160. The heat treatment part 160 includes the treatment chamber 161 for housing a semiconductor wafer W (or the dummy wafer R) and performing a heating treatment, a flash lamp house 5 including a plurality of built-in flash lamps FL, and a halogen lamp house 4 including a plurality of built-in halogen lamps HL. The flash lamp house 5 is provided on an upper side of the heat treatment chamber 161, and the halogen lamp house 4 is provided on a lower side of the heat treatment chamber 161. The heat treatment part 160 further includes a holding part 7 provided inside the heat treatment chamber 161 and for holding the semiconductor wafer W (or the dummy wafer R) in a horizontal attitude, and a transfer mechanism 10 for transferring the semiconductor wafer W (or the dummy wafer R) between the holding part 7 and the transport robot 150.

The heat treatment chamber 161 is configured such that upper and lower chamber windows made of quartz are mounted to the top and bottom, respectively, of a tubular chamber side portion 61. The chamber side portion 61 has a generally tubular shape having an open top and an open bottom. An upper chamber window 63 is mounted to block the top opening of the chamber side portion 61, and a lower chamber window 64 is mounted to block the bottom opening thereof. The upper chamber window 63 forming a ceiling of the heat treatment chamber 161 is a disk-shaped member formed of quartz, and serves as a quartz window that transmits a flash of light emitted from the flash lamps FL therethrough into the heat treatment chamber 161. The lower chamber window 64 constituting a floor of the heat treatment chamber 161 is also a disk-shaped member formed of quartz, and serves as a quartz window that transmits light emitted from the halogen lamps HL therethrough into the heat treatment chamber 161.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from an upper side of the chamber side portion 61. The lower reflective ring 69, on the other hand, is mounted by being inserted upwardly from a lower side of the chamber side portion 61 and fastened with screws not shown. In other words, the upper and lower reflective rings 68 and 69 are removably mounted to the chamber side portion 61. An inner space of the heat treatment chamber 161, that is to say, a space surrounded by the upper chamber window 63, the lower chamber window 64, the chamber side portion 61, and the upper and lower reflective rings 68 and 69, is defined as a heat treatment space 65.

A recessed portion 62 is defined in an inner wall surface of the heat treatment chamber 161 by mounting the upper and lower reflective rings 68 and 69 to the chamber side portion 61. That is to say, the recessed portion 62 is defined which is surrounded by a middle portion of the inner wall surface of the chamber side portion 61 where the upper and lower reflective rings 68 and 69 are not mounted, a lower end surface of the upper reflective ring 68, and an upper end surface of the lower reflective ring 69. The recessed portion 62 is formed in a form of an annular ring along a horizontal direction in the inner wall surface of the heat treatment chamber 161, and surrounds the holding part 7 which holds the semiconductor wafer W. The chamber side portion 61 and the upper and lower reflective rings 68 and 69 are formed of a metal material (for example, stainless steel) with high strength and high heat resistance.

The chamber side portion 61 is provided with a transport opening (throat) 66 for the transport of the semiconductor wafer W (or the dummy wafer R) therethrough into and out of the heat treatment chamber 161. The transport opening 66 can be opened and closed by the gate valve 162. The transport opening 66 is communicably connected to an outer peripheral surface of the recessed portion 62. Thus, when the transport opening 66 is opened by the gate valve 162, the semiconductor wafer W can be transported through the transport opening 66 and the recessed portion 62 into and out of the heat treatment space 65. When the transport opening 66 is closed by the gate valve 162, the heat treatment space 65 in the heat treatment chamber 161 is an enclosed space.

A radiation thermometers 25 and 20 are mounted in locations of an outer wall surface of the chamber side portion 61 where through holes 61a and 61b are provided, respectively. The through hole 61a is a cylindrical hole for directing infrared radiation emitted from an upper surface of the semiconductor wafer W (or the dummy wafer R) held by a susceptor 74 to be described hereinafter therethrough to the radiation thermometer 25. The through hole 61b is a cylindrical hole for directing infrared radiation emitted from a lower surface of the semiconductor wafer W (or the dummy wafer R) held by the susceptor 74 to be described hereinafter therethrough to the radiation thermometer 20. The through holes 61a and 61b are inclined with respect to a horizontal direction so that a longitudinal axis (an axis extending in a direction in which the through holes 61a and 61b extend through the chamber side portion 61) of the through holes 61a and 61b intersect a main surface of the semiconductor wafer W held by the susceptor 74. A transparent window 26 made of barium fluoride material transparent to infrared radiation in a wavelength range measurable with the radiation thermometer 25 is mounted to an end portion of the through hole 61a which faces the heat treatment space 65. A transparent window 21 made of barium fluoride material transparent to infrared radiation in a wavelength range measurable with the radiation thermometer 20 is mounted to an end portion of the through hole 61b which faces the heat treatment space 65.

A gas supply hole 81 for supplying a treatment gas therethrough into the heat treatment space 65 is provided in an upper portion of the inner wall of the heat treatment chamber 161. The gas supply hole 81 is provided in a position on an upper side of the recessed portion 62, and may be provided in the upper reflective ring 68. The gas supply hole 81 is communicably connected to a gas supply pipe 83 through a buffer space 82 formed in a form of an annular ring inside the side wall of the heat treatment chamber 161. The gas supply pipe 83 is connected to a treatment gas supply source 85. A valve 84 is inserted at some midpoint in the gas supply pipe 83. When the valve 84 is opened, the treatment gas is supplied from the treatment gas supply source 85 to the buffer space 82. The treatment gas which has flowed into the buffer space 82 flows in a spreading manner within the buffer space 82 which is lower in fluid resistance than the gas supply hole 81, and is supplied through the gas supply hole 81 into the heat treatment space 65. Examples of the treatment gas usable herein include inert gases such as nitrogen (N2) gas, and reactive gases such as hydrogen (H2) gas and ammonia (NH3) gas (although nitrogen gas is used in the present embodiment).

In the meanwhile, a gas exhaust hole 86 for exhausting a gas from the heat treatment space 65 is provided in a lower portion of the inner wall of the heat treatment chamber 161. The gas exhaust hole 86 is provided in a lower side position than the recessed portion 62, and may be provided in the lower reflective ring 69. The gas exhaust hole 86 is communicably connected to a gas exhaust pipe 88 through a buffer space 87 formed in a form of an annular ring inside the side wall of the heat treatment chamber 161. The gas exhaust pipe 88 is connected to an exhaust mechanism 190. A valve 89 is inserted at some midpoint in the gas exhaust pipe 88. When the valve 89 is opened, the gas in the heat treatment space 65 is exhausted through the gas exhaust hole 86 and the buffer space 87 to the gas exhaust pipe 88. The gas supply hole 81 and the gas exhaust hole 86 may include a plurality of gas supply holes 81 and a plurality of gas exhaust holes 86, respectively, arranged along a circumferential direction of the heat treatment chamber 161, and may be in a form of slits. The treatment gas supply source 85 and the exhaust mechanism 190 may be mechanisms provided in the heat treatment apparatus 100 or be utility systems in a factory in which the heat treatment apparatus 100 is installed.

A gas exhaust pipe 191 for exhausting the gas from the heat treatment space 65 is also connected to a distal end of the transport opening 66. The gas exhaust pipe 191 is connected through a valve 192 to the exhaust mechanism 190. By opening the valve 192, the gas in the heat treatment chamber 161 is exhausted through the transport opening 66.

Figure 3:
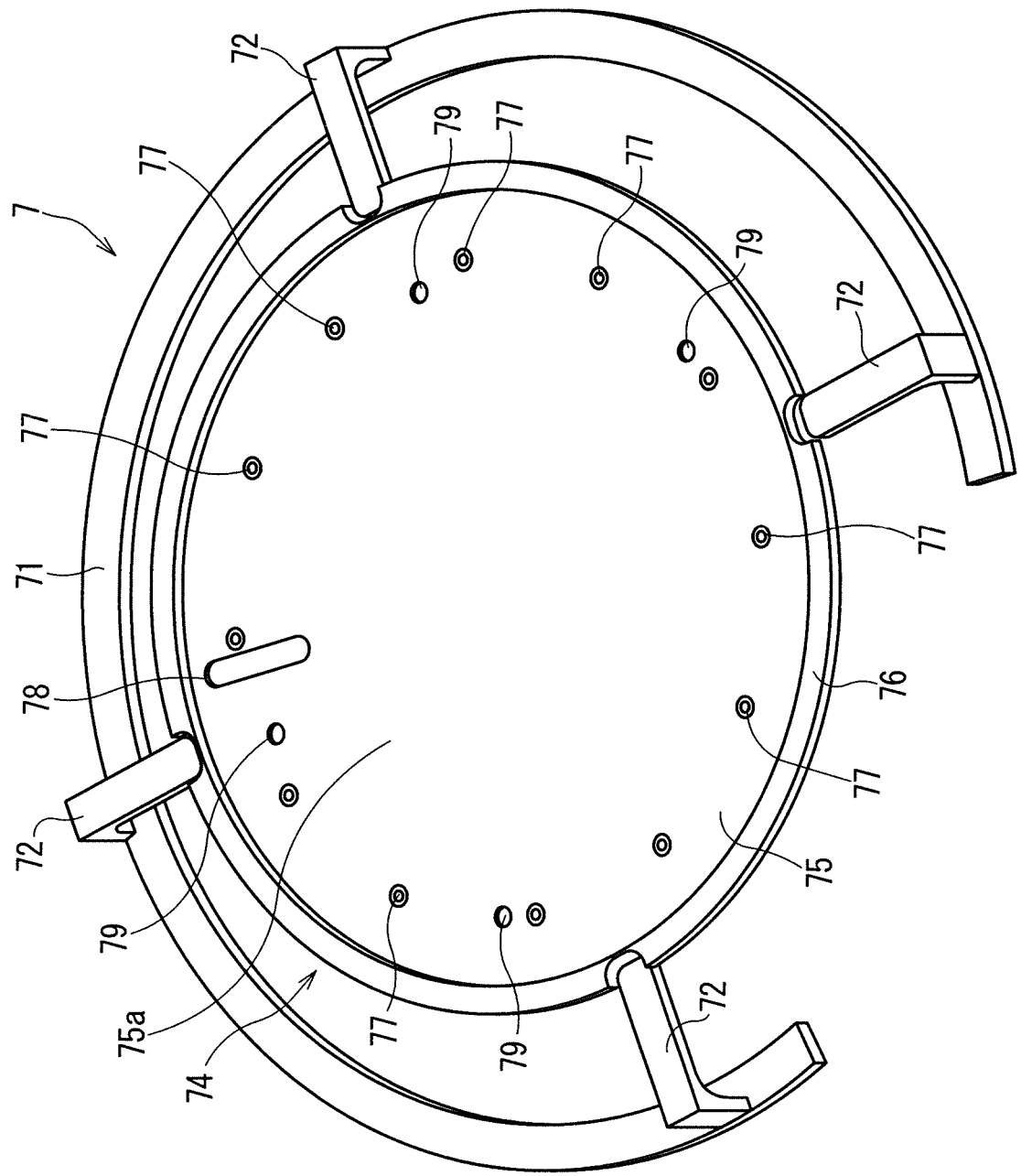
FIG. 3 is a perspective view showing an entire external appearance of a holding part.

FIG. 3 is a perspective view showing an entire external appearance of the holding part 7. The holding part 7 includes a base ring 71, coupling portions 72, and the susceptor 74. The base ring 71, the coupling portions 72, and the susceptor 74 are all formed of quartz. In other words, the whole of the holding part 7 is formed of quartz.

The base ring 71 is a quartz member having an arcuate shape obtained by removing a portion from an annular shape. This removed portion is provided to prevent interference between transfer arms 11 of the transfer mechanism 10 to be described hereinafter and the base ring 71. The base ring 71 is supported by a wall surface of the heat treatment chamber 161 by being placed on the bottom surface of the recessed portion 62 (with reference to FIG. 2). The plurality of coupling portions 72 (in the present embodiment, four coupling portions 72) are mounted upright on the upper surface of the base ring 71 and arranged in a circumferential direction of the annular shape thereof. The coupling portions 72 are also quartz members, and are rigidly secured to the base ring 71 by welding.

Figure 4:
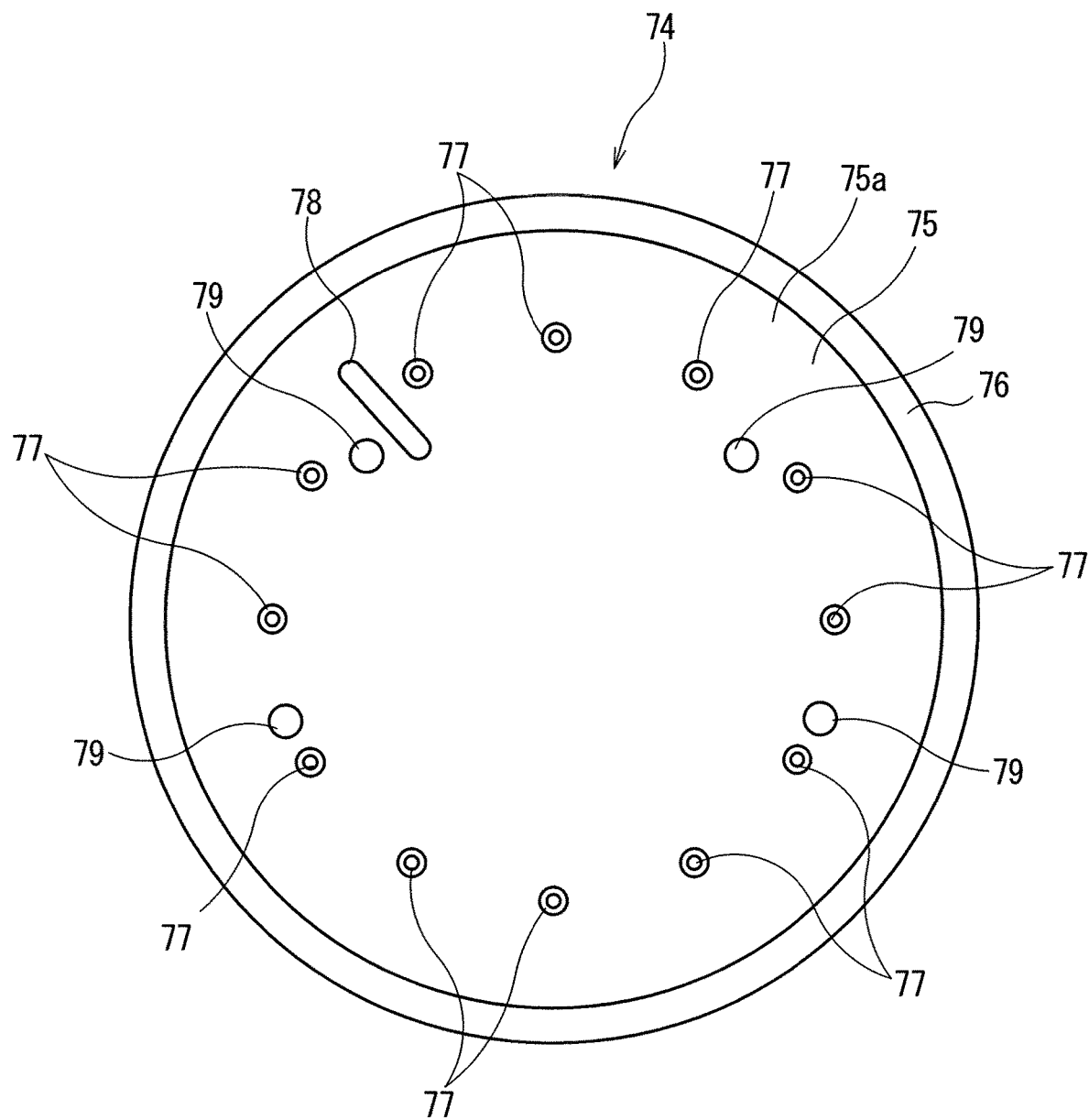
FIG. 4 is a plan view of a susceptor.

The susceptor 74 is supported by the four coupling portions 72 provided on the base ring 71. FIG. 4 is a plan view of the susceptor 74. The susceptor 74 includes a holding plate 75, a guide ring 76, and a plurality of substrate support pins 77. The holding plate 75 is a generally circular planar member formed of quartz. A diameter of the holding plate 75 is larger than that of the semiconductor wafer W. In other words, the holding plate 75 has a size, as seen in a plan view, larger than that of the semiconductor wafer W.

The guide ring 76 is provided on a peripheral part of the upper surface of the holding plate 75. The guide ring 76 is an annular member having an inner diameter larger than the diameter of the semiconductor wafer W. For example, when the diameter of the semiconductor wafer W is 300 mm, the inner diameter of the guide ring 76 is 320 mm. The inner periphery of the guide ring 76 is in a form of a tapered surface which becomes wider in an upward direction from the holding plate 75. The guide ring 76 is formed of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The plurality of substrate support pins 77 are provided upright on the holding surface 75a of the holding plate 75. In the present embodiment, a total of 12 substrate support pins 77 provided upright are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is smaller than the diameter of the semiconductor wafer W, and is 270 to 280 mm (in the present embodiment, 270 mm) when the diameter of the semiconductor wafer W is 300 mm. Each of the substrate support pins 77 is formed of quartz. The plurality of substrate support pins 77 may be provided by welding on the upper surface of the holding plate 75 or machined integrally with the holding plate 75.

Referring again to FIG. 3, the four coupling portions 72 provided upright on the base ring 71 and the peripheral part of the holding plate 75 of the susceptor 74 are rigidly secured to each other by welding. In other words, the susceptor 74 and the base ring 71 are fixedly coupled to each other with the coupling portions 72. The base ring 71 of such a holding part 7 is supported by the wall surface of the heat treatment chamber 161, whereby the holding part 7 is mounted to the heat treatment chamber 161. With the holding part 7 mounted to the heat treatment chamber 161, the holding plate 75 of the susceptor 74 assumes a horizontal attitude (an attitude such that the normal to the holding plate 75 coincides with a vertical direction). In other words, the holding surface 75a of the holding plate 75 becomes a horizontal surface.

The semiconductor wafer W (or the dummy wafer R) transported into the heat treatment chamber 161 is placed and held in a horizontal attitude on the susceptor 74 of the holding part 7 mounted to the heat treatment chamber 161. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W can be supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the plurality of substrate support pins 77 is spaced a predetermined distance apart from the holding surface 75a of the holding plate 75. A thickness of the guide ring 76 is larger than the height of the substrate support pins 77. Thus, the guide ring 76 prevents the horizontal misregistration of the semiconductor wafer W supported by the plurality of substrate support pins 77.

As shown in FIGS. 3 and 4, an opening 78 is formed in the holding plate 75 of the susceptor 74 so as to pass vertically through the holding plate 75 of the susceptor 74. The opening 78 is provided for a radiation thermometer 20 (see FIG. 2) to receive radiation (infrared radiation) emitted from the lower surface of the semiconductor wafer W held by the susceptor 74. In other words, the radiation thermometer 20 receives the light emitted from the lower surface of the semiconductor wafer W (or the dummy wafer R) held by the susceptor 74 through the opening 78, and measures the temperature of the semiconductor wafer W (or the dummy wafer R). The holding plate 75 of the susceptor 74 further includes four through holes 79 bored therein and designed so that lift pins 12 of the transfer mechanism 10 to be described hereinafter pass through the through holes 79, respectively, to transfer the semiconductor wafer W (or the dummy wafer R).

Figure 5:
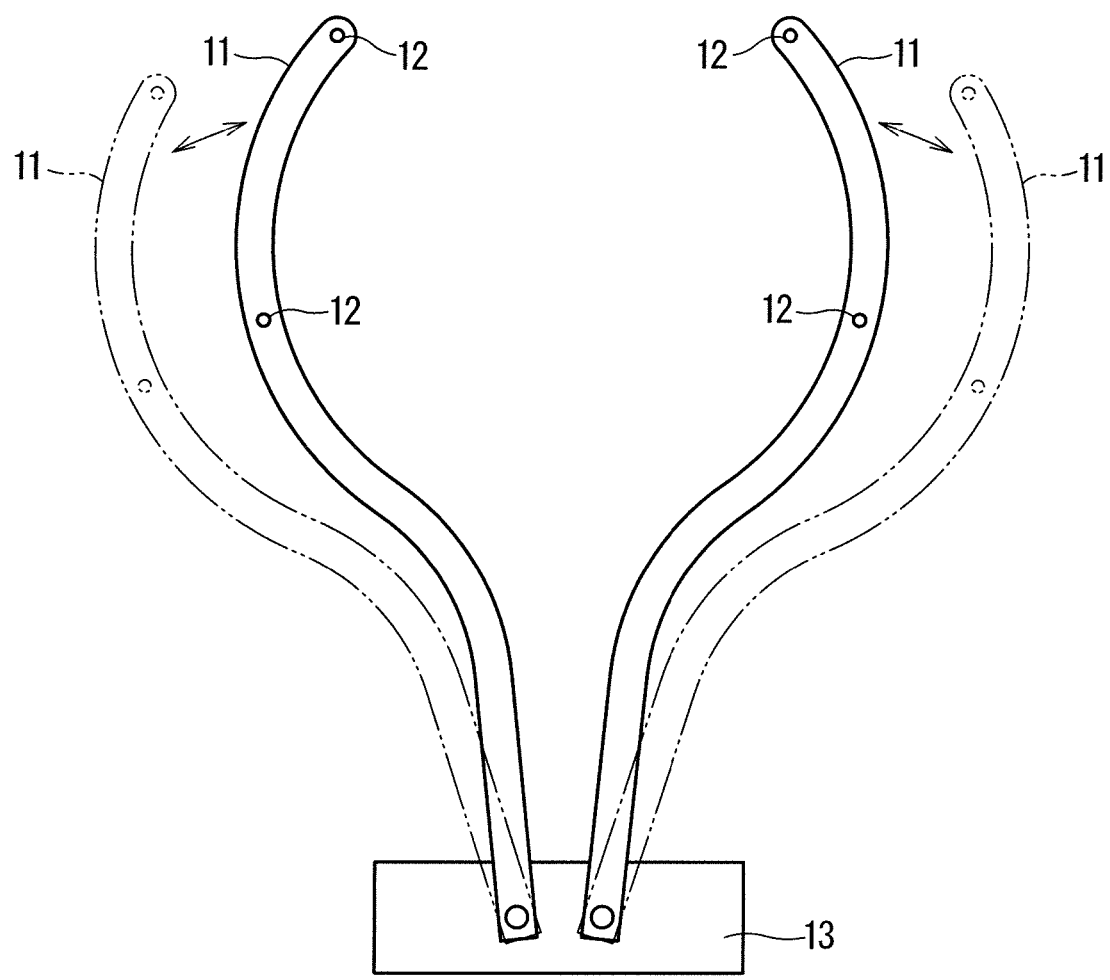
FIG. 5 is a plan view of a transfer mechanism.
Figure 6:
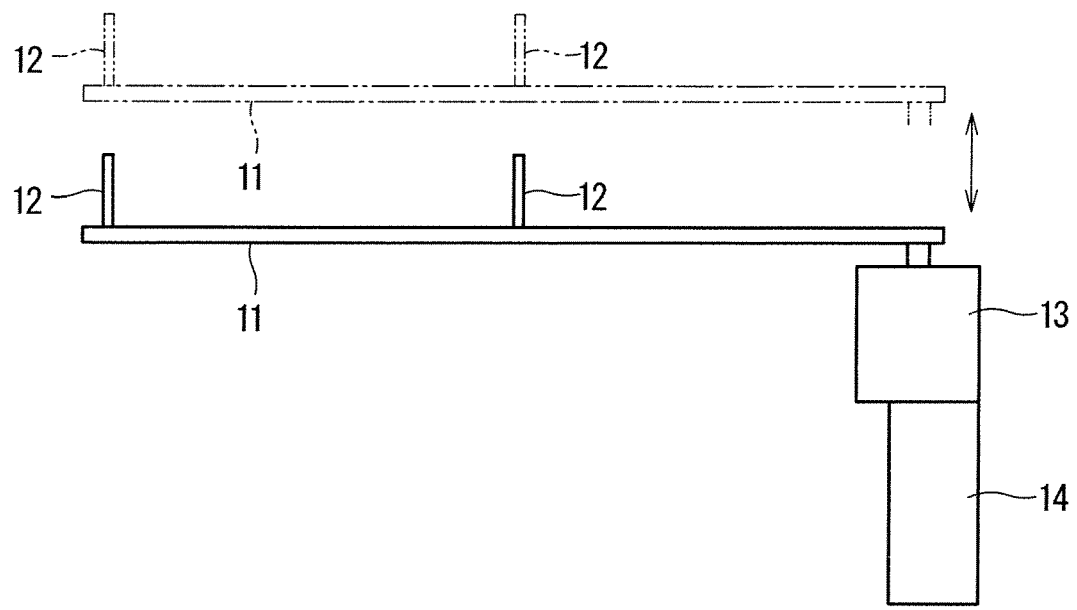
FIG. 6 is a side view of the transfer mechanism.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which the semiconductor wafer W is transferred to and from the holding part 7 and a retracted position (a position indicated by dash-double-dot lines in FIG. 5) in which the transfer arms 11 do not overlap the semiconductor wafer W held by the holding part 7 as seen in a plan view. The transfer operation position is located below the susceptor 74 and the retracted position is located outside the susceptor 74. The horizontal movement mechanism 13 may be of the type which causes individual motors to pivot the transfer arms 11 respectively or of the type which uses the linkage mechanism to cause a single motor to pivot the pair of transfer arms 11 in cooperative relation. The pair of transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective through holes 79 (with reference to FIGS. 3 and 4) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holding part 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the heat treatment chamber 161.

Referring again to FIG. 2, the flash lamp house 5 provided on an upper side of the heat treatment chamber 161 includes an enclosure 51, a light source provided inside the enclosure 51 and including the multiple (in the present embodiment, 30) xenon flash lamps FL, and a reflector 52 provided inside the enclosure 51 so as to cover the upper side of the light source. The flash lamp house 5 further includes a lamp light radiation window 53 mounted to the bottom of the enclosure 51. The lamp light radiation window 53 forming the floor of the flash lamp house 5 is a plate-like quartz window formed of quartz. The flash lamp house 5 is provided on the upper side of the heat treatment chamber 161, whereby the lamp light radiation window 53 is opposed to the upper chamber window 63. The flash lamps FL direct a flash of light from over the heat treatment chamber 161 through the lamp light radiation window 53 and the upper chamber window 63 toward the heat treatment space 65.

The plurality of flash lamps FL, each of which is a rod-shaped lamp having an elongated cylindrical shape, are arranged in a plane so that the longitudinal directions of the respective flash lamps FL are in parallel with each other along a main surface of the semiconductor wafer W held by the holding part 7 (that is, in the horizontal direction). Thus, a plane defined by the arrangement of the flash lamps FL is also a horizontal plane.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to an outer peripheral surface of the glass tube. Because the xenon gas is electrically insulative, no current flows in the glass tube in a normal state even if electrical charge is stored in the capacitor. However, if high voltage is applied to the trigger electrode to produce an electrical breakdown, electricity stored in the capacitor flows momentarily in the glass tube, and xenon atoms or molecules are excited at this time to cause light emission. This xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect the flash of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen lamp house 4 provided under the heat treatment chamber 161 includes an enclosure 41 incorporating the plurality of (in the present embodiment, 40) halogen lamps HL. The plurality of halogen lamps HL direct light from under the heat treatment chamber 161 through the lower chamber window 64 toward the heat treatment space 65.

Figure 7:
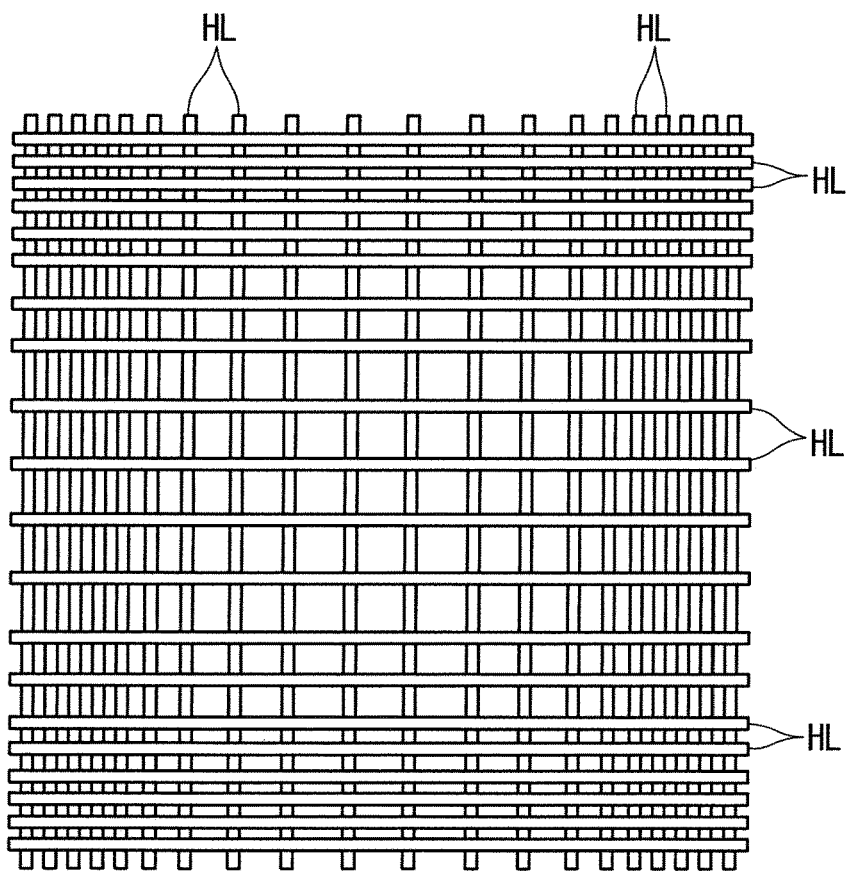
FIG. 7 is a plan view showing an arrangement of a plurality of halogen lamps HL.

FIG. 7 is a plan view showing an arrangement of the plurality of halogen lamps HL. In the present embodiment, the 20 halogen lamps HL are disposed in each of two upper and lower tiers. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of the semiconductor wafer W held by the holding part 7 (that is, in the horizontal direction). Thus, a plane defined by the arrangement of the halogen lamps HL in each of the upper and lower tiers is also a horizontal plane.

The group of halogen lamps HL in the upper tier and the group of halogen lamps HL in the lower tier are arranged to intersect each other in a lattice pattern. In other words, the 40 halogen lamps HL in total are disposed so that the longitudinal direction of each halogen lamp HL arranged in the upper tier and the longitudinal direction of each halogen lamp HL arranged in the lower tier are orthogonal to each other.

Each of the halogen lamps HL is a filament-type light source which passes current through a filament disposed in a glass tube to make the filament incandescent, thereby emitting light. Gas prepared by introducing a halogen element (iodine, bromine and the like) in trace amounts into inactive gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. Thus, the halogen lamps HL are continuous lighting lamps that emit light continuously for at least not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL. A reflector 43 is provided also inside the enclosure 41 of the halogen lamp house 4 under the halogen lamps HL arranged in two tiers (FIG. 3). The reflector 43 reflects the light emitted from the halogen lamps HL toward the heat treatment space 65.

The heat treatment part 160 further includes various cooling structures to prevent an excessive temperature rise in the halogen lamp house 4, the flash lamp house 5, and the heat treatment chamber 161 because of the heat energy generated from the halogen lamps HL and the flash lamps FL during the heat treatment of the semiconductor wafer W. As an example, a water cooling tube (not shown) is provided in the walls of the heat treatment chamber 161. Also, the halogen lamp house 4 and the flash lamp house 5 have an air cooling structure for forming a gas flow therein to exhaust heat. Air is supplied to a gap between the upper chamber window 63 and the lamp light radiation window 53 to cool down the flash lamp house 5 and the upper chamber window 63.

Figure 8:
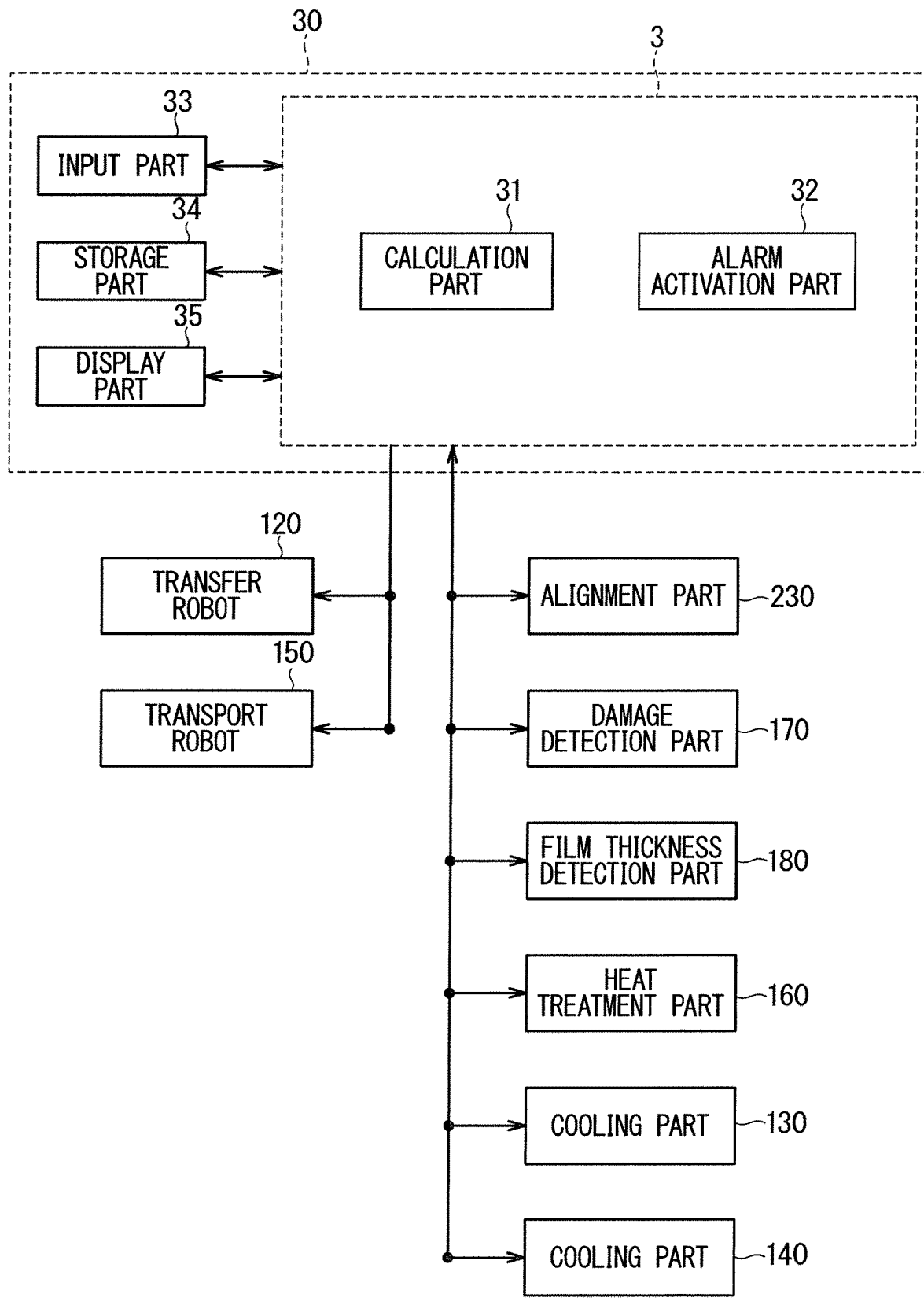
FIG. 8 is a function block diagram schematically showing an example of an electrical configuration of the heat treatment apparatus.

The controller 3 controls the aforementioned various operating mechanisms provided in the heat treatment apparatus 100. FIG. 8 is a function block diagram schematically showing an example of an electrical configuration of the heat treatment apparatus 100. The heat treatment apparatus 100 includes a computer 30 controlling each treatment unit (the alignment part 230, the damage detection part 170, the film thickness detection part 180, the heat treatment part 160, and the cooling parts 130 and 140), the transport robot 150, and the transfer robot 120. The computer 30 may have a form of a personal computer (FA personal computer), and includes the controller (control circuit) 3, an input part 33, the storage part 34, and a display part 35. The controller 3 includes an arithmetic processing unit such as CPU. The input part 33 includes an input apparatus such as a key board, a pointing device, and a touch panel. Furthermore, the input part 33 includes a communication module for communication with a host computer. The storage part 34 includes a storage device such as a solid memory device and a hard disk drive. The display part 35 includes a liquid crystal display, for example, and displays various types of information under control of the controller 3. A liquid crystal display, for example, is adopted as the display part 35. The CPU in the controller 3 executes a predetermined treatment program, whereby the processes in the heat treatment apparatus 100 proceed. For example, the controller 3 controls the transport mechanism including the transport robot 150 and the transfer robot 120 so that the semiconductor wafer W (or the dummy wafer R) is transported along a transport route which has been set. Although FIG. 1 shows the controller 3 between the indexer 101 and the alignment part 230, however, the configuration is not limited thereto. The controller 3 can be arranged at an optional position in the heat treatment apparatus 100.

Figure 9:
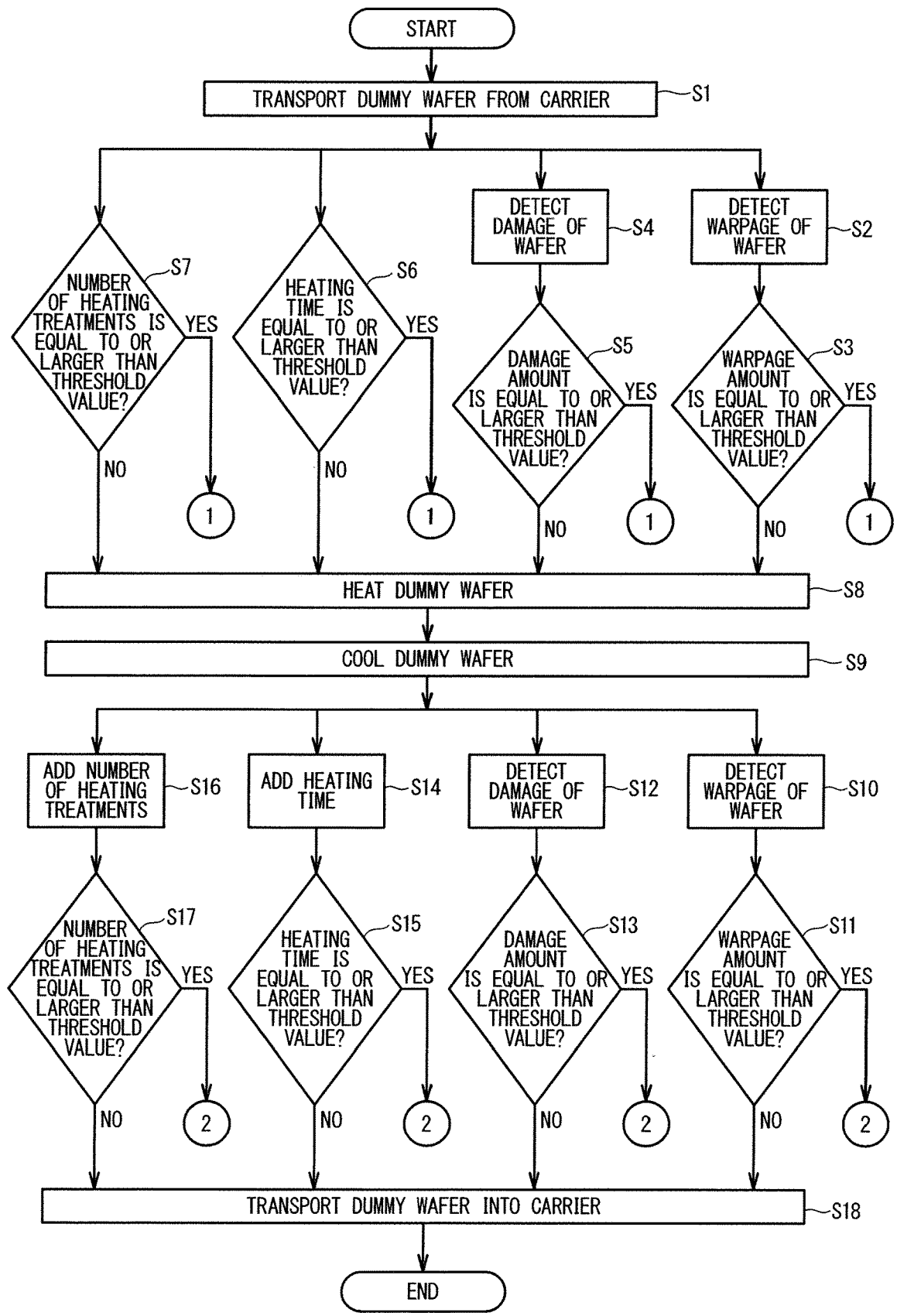
FIG. 9 is a flow chart showing a management procedure of a dummy wafer.

As shown in FIG. 9, the controller 3 includes a calculation part 31 and an alarm activation part 32. The calculation part 31 and the alarm activation part 32 are each function processing part achieved by a CPU in the controller 3 executing a predetermined treatment program. Processing details of the calculation part 31 and the alarm activation part 32 will be described in more detail below.

Next, a treatment operation of the heat treatment apparatus 100 according to the present invention will be described. Herein, management of the dummy wafer R is described after the treatment operation on the normal semiconductor wafer W is described. The semiconductor wafer W to be treated herein is a semiconductor substrate doped with impurities (ions) by an ion implantation process. The impurities are activated by the heat treatment apparatus 100 performing the treatment of heating (annealing) the semiconductor wafer W by irradiation with a flash of light.

When the normal semiconductor wafer W is treated, firstly, a plurality of untreated semiconductor wafers W implanted with impurities and housed in the carriers CA are placed on the load port 110 of the indexer 101. The transfer robot 120 takes out the untreated semiconductor wafers W one by one from the carrier CA to transport the semiconductor wafers W into the alignment chamber 231 of the alignment part 230. In the alignment chamber 231, the semiconductor wafer W is rotated around the vertical direction axis about the rotation center that is the center portion of the semiconductor wafer W in the horizontal plane, and a notch, for example, is optically detected to adjust a direction of the semiconductor wafer W.

Next, the transport robot 150 takes the semiconductor wafer W whose direction is adjusted out of the alignment chamber 231 to transport the semiconductor wafer W to the transport chamber 151. The transport robot 150 having taken out the semiconductor wafer W turns to face toward the heat treatment part 160. Subsequently, the gate valve 162 opens a portion between the heat treatment chamber 161 and the transport chamber 151, and the transport robot 150 transports the untreated semiconductor wafer W into the heat treatment chamber 161. At this time, if the preceding semiconductor wafer W on which the heating treatment has been performed is in the heat treatment chamber 161, one of the two transport hands 152 takes out the semiconductor wafer W on which the heating treatment has been performed and then the other one thereof transports the untreated semiconductor wafer W into the heat treatment chamber 161, whereby the wafers are replaced. Subsequently, the gate valve 162 closes the portion between the heat treatment chamber 161 and the transport chamber 151.

The semiconductor wafer W transported into the heat treatment chamber 161 is preheated by the halogen lamps HL, and then is subjected to the flash heat treatment by a flash irradiation from the flash lamps FL. This flash heat treatment activates the impurities implanted into the semiconductor wafer W.

After the flash heat treatment is finished, the gate valve 162 opens the portion between the heat treatment chamber 161 and the transport chamber 151, and the transport robot 150 transports the dummy wafer R on which the flash heat treatment has been performed from the heat treatment chamber 161 to the transport chamber 151. The transport robot 150 having taken out the semiconductor wafer W turns to face toward the first cooling chamber 131 or the second cooling chamber 141 from the heat treatment chamber 161. The gate valve 162 closes the portion between the heat treatment chamber 161 and the transport chamber 151.

Subsequently, the transport robot 150 transports the semiconductor wafer W on which the heating treatment has been performed into the first cooling chamber 131 of the cooling part 130 or the second cooling chamber 141 of the cooling part 140. The first cooling chamber 131 or the second cooling chamber 141 performs a cooling treatment on the semiconductor wafer W on which the flash heat treatment has been performed. At a point in time when the semiconductor wafer W is transported out of the heat treatment chamber 161 of the heat treatment part 160, the temperature of the entire semiconductor wafer W is relatively high, and therefore is cooled to approximately a room temperature by the first cooling chamber 131 or the second cooling chamber 141.

After a predetermined cooling treatment time passes, the transport robot 150 transports the cooled semiconductor wafer W out of the first cooling chamber 131 or the second cooling chamber 141 and transports the cooled semiconductor wafer W into the transport chamber 151 again. The semiconductor wafer W transported into the transport chamber 151 is transported into the film thickness detection chamber 181 of the film thickness detection part 180. The film thickness detection chamber 181 measures a thickness of a film formed on the semiconductor wafer W. The measured film thickness is compared with a preset threshold value by the controller 3. When the measured film thickness exceeds the threshold value as a result of comparison between the film thickness measured by the controller 3 and the threshold value, the storage part 34 stores data that the semiconductor wafer W is a non-usable semiconductor wafer W. The semiconductor wafer W determined as the non-usable semiconductor wafer W in the data is transported into the carrier CA for disposal. In contrast, when the measured film thickness is within the threshold value, the semiconductor wafer W is returned to the original carrier CA. After the carrier CA houses a predetermined number of treated semiconductor wafers W, this carrier CA is transported out of the load port 110 of the indexer 101.

The heating treatment in the heat treatment part 160 will continue to be described. Prior to the transportation of the semiconductor wafer W into the heat treatment chamber 161, the valve 84 for air supply is opened and the valves 89 and 192 for air exhaust are opened to start air supply and exhaust within the heat treatment chamber 161. When the valve 84 is opened, nitrogen gas is supplied from the gas supply opening 81 into the heat treatment space 65. When the valve 89 is opened, the gas within the heat treatment chamber 161 is exhausted through the gas exhaust hole 86. This causes the nitrogen gas supplied from an upper portion of the heat treatment space 65 in the heat treatment chamber 161 to flow downwardly and then to be exhausted from a lower portion of the heat treatment space 65.

The gas within the heat treatment chamber 161 is exhausted also through the transport opening 66 by opening the valve 192. Further, the exhaust mechanism not shown exhausts also an atmosphere near the drivers of the transfer mechanism 10. The nitrogen gas is continuously supplied into the heat treatment space 65 at the time of the heat treatment of the semiconductor wafer W in the heat treatment part 160, and an amount of supply is appropriately changed in accordance with a treatment process.

Subsequently, the gate valve 162 is opened to open the transport opening 66. The transport robot 150 transports the semiconductor wafer W to be treated through the transport opening 66 into the heat treatment space 65 in the heat treatment chamber 161. The transport robot 150 causes the transport hand 152 holding the untreated semiconductor wafer W to move forward to a position immediately over the holding part 7 and stop. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the untreated semiconductor wafer W is placed on the lift pins 12, the transport robot 150 moves the transport hand 152 out of the heat treatment space 65, and the gate valve 162 closes the transport opening 66. Then, the pair of transfer arms 11 moves downwardly to transfer the semiconductor wafer W from the transfer mechanism 10 to the susceptor 74 of the holding part 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holding part 7 in such an attitude that the front surface thereof where a pattern is formed and the impurity is implanted is the upper surface. A predetermined distance is defined between a back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

After the semiconductor wafer W is held in a horizontal attitude from below by the susceptor 74 of the holding part 7, the 40 halogen lamps HL turn on simultaneously to start preheating (or assist-heating). Halogen light emitted from the halogen lamps HL is transmitted through the lower chamber window 64 and the susceptor 74 both made of quartz, and impinges from the lower surface of the semiconductor wafer W. By receiving irradiation with light from the halogen lamps HL, the semiconductor wafer W is preheated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W is measured with the radiation thermometer 20 when the halogen lamps HL perform the preheating. Specifically, the radiation thermometer 20 receives infrared radiation emitted from the lower surface of the semiconductor wafer W held by the susceptor 74 through the opening 78 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined preheating temperature T1 or not. In other words, the controller 3 effects feedback control of the output from the halogen lamps HL so that the temperature of the semiconductor wafer W is equal to the preheating temperature T1, based on the value measured with the radiation thermometer 20. The preheating temperature T1 is set to be approximately 600° C. to 800° C. so that there is no possibility of diffusion of the impurity added to the semiconductor wafer W caused by the heat (700° C. in the present embodiment).

After the temperature of the semiconductor wafer W reaches the preheating temperature T1, the controller 3 maintains the temperature of the semiconductor wafer W at the preheating temperature T1 for a short time. Specifically, at the point in time when the temperature of the semiconductor wafer W measured with the radiation thermometer 20 reaches the preheating temperature T1, the controller 3 adjusts the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in the peripheral portion thereof where heat dissipation is liable to occur than in the central portion thereof. However, the halogen lamps HL in the halogen lamp house 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating.

At a time when a predetermined period of time has elapsed since the temperature of the semiconductor wafer W reaches the preheating temperature T1, the flash lamps FL irradiate the front surface of the semiconductor wafer W with a flash of light. At this time, part of the flash of light emitted from the flash lamps FL travels directly toward the interior of the heat treatment chamber 161. The remainder of the flash of light is reflected once from the reflector 52, and then travels toward the interior of the heat treatment chamber 161. The irradiation of the semiconductor wafer W with such flashes of light achieves the flash heating of the semiconductor wafer W.

The flash heating, which is achieved by the emission of a flash of light from the flash lamps FL, is capable of increasing the temperature of the front surface of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The temperature of the front surface of the semiconductor wafer W is increased instantaneously to a treatment temperature T2 of 1000° C. or more by the flash irradiation from the flash lamps FL, and after the impurity implanted into the semiconductor wafer W is activated, the temperature of the front surface decreases rapidly. Since the flash heating is capable of increasing and decreasing the temperature of the front surface of the semiconductor wafer W in an extremely short time, it is possible to activate the impurities implanted in the semiconductor wafer W while suppressing the diffusion of the impurities due to heat. The time required for the activation of the impurity is extremely shorter than the time required for a heat diffusion, thus the activation is completed in a short time of approximately 0.1 milliseconds to 100 milliseconds in which the diffusion does not occur.

When the flash heat treatment is finished, the halogen lamps HL are turned off after an elapse of a predetermined period of time. Accordingly, the temperature of the semiconductor wafer W decreases rapidly from the preheating temperature T1. The radiation thermometer 20 measures the temperature of the semiconductor wafer W which is on the decrease. The result of measurement is transmitted to the controller 3. The controller 3 monitors whether the temperature of the semiconductor wafer W is decreased to a predetermined temperature or not, based on the result of measurement with the radiation thermometer 20. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 162, and the treated semiconductor wafer W placed on the lift pins 12 is transported by the transport hand 152 of the transport robot 150. The transport robot 150 causes the transport hand 152 to move forward to a position immediately below the semiconductor wafer W protruded upward by the lift pins 12 and stop. Then, when the pair of transfer arms 11 move downwardly, the semiconductor wafer W on which the flash heating has been performed is transferred to the transport hand 152 and placed. Subsequently, the transport robot 150 moves the transport hand 152 out of the heat treatment chamber 161 to transport the semiconductor wafer W which has been treated out of the heat treatment chamber 161.

A treatment of the semiconductor wafer W is typically performed in a unit of lot. The lot indicates one group of semiconductor wafer W subjected to the same treatment under the same condition. Also in the heat treatment apparatus 100 of the present embodiment, the plurality of (for example, 25) semiconductor wafers W constituting the lot are housed in one carrier CA and placed on the load port 110 of the indexer 101, and then transported one by one from the carrier CA into the heat treatment chamber 161 in series and the heating treatment is performed.

Herein, when the treatment of the lot is started in the heat treatment apparatus 100 which has not performed the treatment for a while, the first semiconductor wafer W in the lot is transported into the heat treatment chamber 161 having substantially a room temperature, and then the preheating and the flash heat treatment are performed. Examples of such a case include a case where a first lot is processed when the heat treatment apparatus 100 is activated after maintenance or a case where a long period of time has passed after processing a preceding lot. At the time of the heating treatment, a heat conduction from the semiconductor wafer W increased in temperature to the susceptor 74 occurs, thus the susceptor 74 which initially has a room temperature is gradually increased in temperature by a thermal storage as the number of semiconductor wafers W which have been treated increases. Part of infrared radiation emitted from the halogen lamps HL is absorbed by the lower chamber window 64, thus the temperature of the lower chamber window 64 gradually increases as the number of semiconductor wafers W which have treated increases.

When the heating treatment is performed on around ten semiconductor wafers W, the temperature of the susceptor 74 and the lower chamber window 64 reaches a certain stable temperature. In the susceptor 74 which has reached the stable temperature, a heat transfer amount from the semiconductor wafer W to the susceptor 74 comes into balance with a heat radiation amount from the susceptor 74. The heat transfer amount from the semiconductor wafer W is larger than the heat radiation amount from the susceptor 74 until the temperature of the susceptor 74 reaches the stable temperature, thus the temperature of the susceptor 74 gradually increases by the thermal storage as the number of semiconductor wafers W which have been treated increases. In contrast, after the temperature of the susceptor 74 reaches the stable temperature, the heat transfer amount from the semiconductor wafer W comes into balance with the heat radiation amount from the susceptor 74, thus the temperature of the susceptor 74 is maintained at the certain stable temperature. After the temperature of the lower chamber window 64 reaches the stable temperature, an amount of heat absorbed by the lower chamber window 64 from light emitted from the halogen lamps HL comes into balance with an amount of heat emitted from the lower chamber window 64, thus also the temperature of the lower chamber window 64 is maintained at the certain stable temperature.

When the treatment is started in the heat treatment chamber 161 having a room temperature as described above, there is a problem that a temperature history becomes ununiform due to the difference of the temperature of the structure of the heat treatment chamber 161 between the semiconductor wafer W early in the lot and the semiconductor wafer W at the midpoint of the lot. The semiconductor wafer W early in the lot is supported by the susceptor 74 having a low temperature and flash heat treatment is performed thereon, thus warpage of the wafer occurs in some cases. Thus, performed is a dummy running in which the dummy wafer R which is not to be treated is transported into the heat treatment chamber 161 and the preheating and the flash heat treatment is performed on the dummy wafer R in the manner similar to the semiconductor wafer W to be treated to increase the temperature of an in-chamber structure such as the susceptor 74 to the stable temperature before starting the processing of the lot. The preheating and the flash heat treatment are performed on around ten dummy wafers R to make a temperature of the in-chamber structure such as the susceptor 74 reach the stable temperature. Such a dummy running is executed not only in a case of starting the treatment in the heat treatment chamber 161 at the room temperature but also in a case of changing the preheating temperature T1 and the treatment temperature T2. As described above, the preheating and the flash heat treatment are performed on the dummy wafer R repeatedly, thus the deterioration of the dummy wafer R proceeds and breakage or warpage of the wafer easily occurs. Thus, a deterioration state of the dummy wafer R needs to be appropriately managed. Management of the dummy wafer R in the heat treatment apparatus 100 is described hereinafter.

Figure 10:
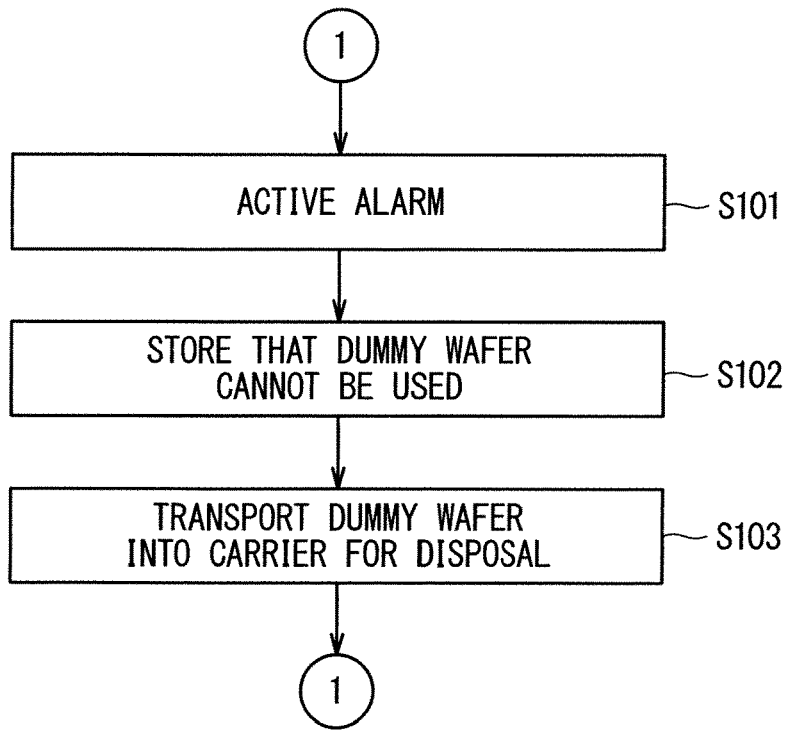
FIG. 10 is a flow chart showing a management procedure of a dummy wafer.
Figure 11:
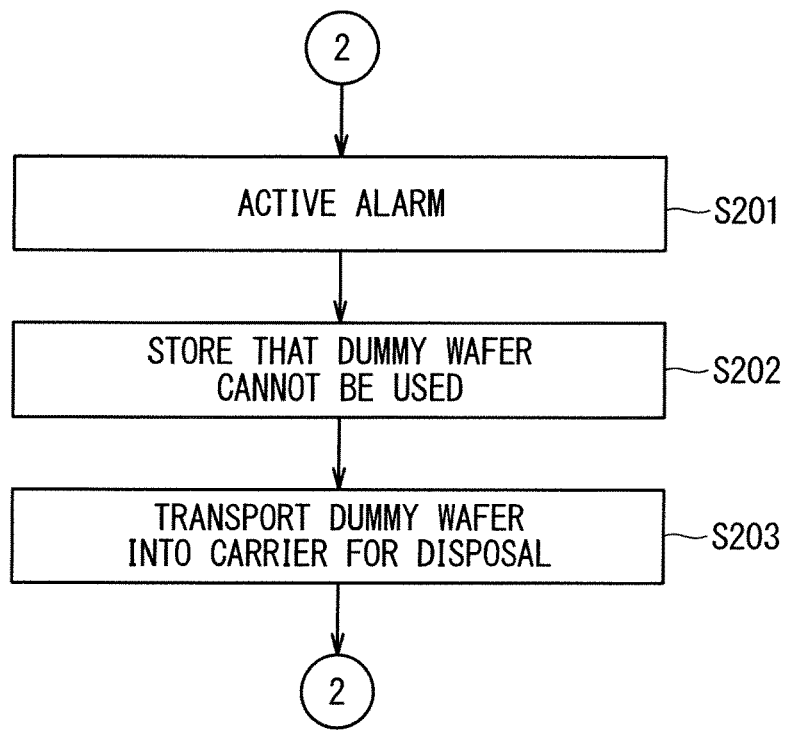
FIG. 11 is a flow chart showing a management procedure of a dummy wafer.

FIG. 9 to FIG. 11 are flow charts showing a management procedure of the dummy wafer R. The dummy wafer R is a disk-shaped silicon wafer similar to the semiconductor wafer W to be treated, and has a size and a shape similar to the semiconductor wafer W. However, a pattern formation and an ion implantation are not performed on the dummy wafer R. That is to say, the dummy wafer R is a so-called bare wafer.

It is confirmed firstly whether or not a wafer, a transportation of which is to be started, is the dummy wafer R in performing dummy running. The dummy wafer R is housed in a carrier CA (dummy carrier) only for the dummy wafer R different from the carrier CA housing the normal semiconductor wafer W and carried. When such a carrier CA only for the dummy wafer R is placed on the load port 110 of the indexer 101, a tag assigned to the carrier CA is read, thus the controller 3 recognizes that the carrier CA is the dummy carrier. When the wafer, a transportation of which is to be started, is a wafer housed in the dummy carrier, the controller 3 determines that the wafer is the dummy wafer R. When the wafer, the transportation of which is to be started, is not the dummy wafer R, the dummy running is not started. A formation itself of the carrier CA only for the dummy wafer R is the same as the carrier CA housing the normal semiconductor wafer W, and is a FOUP in the present embodiment.

When the wafer, the transportation of which is to be started, is the dummy wafer R, the dummy wafer R is transported from the indexer 101 to the alignment part 230 by the transfer robot 120 (Step S1). A transportation procedure of the dummy wafer R is substantially similar to the transportation procedure of the semiconductor wafer W to be treated described above.

The dummy wafer R is transported into the alignment part 230, and positioning of the dummy wafer R is performed. While the positioning is performed, the warpage detection mechanism 232 optically detects warpage of the dummy wafer R (Step S2). Information of the detected warpage of the dummy wafer R is input to the storage part 34 and the calculation part 31. The calculation part 31 calculates whether a value of the warpage information of the dummy wafer R is within or beyond a range of a threshold value previously stored in the storage part 34 (Step S3).

The value of the warpage information can also be referred to as a warpage amount. The value of the warpage information is a direction of the warpage and a width of the warpage, for example. The value of the warpage information is preferably a multiplication of the direction of the warpage and the width of the warpage. In FIG. 1, the direction of the warpage indicates a direction whether it is + or − with respect to the Z axis direction. This is necessary by reason that relationship between the direction of the warpage and the width of the warpage is changed depending on a type of holding the semiconductor wafer W in a subsequent heat treatment in the heat treatment part 160. A predetermined value can be changed depending on the type of holding the semiconductor wafer W. For example, in a case of a type of holding the semiconductor wafer W from a lower side, a threshold value of the warpage in the −Z direction in FIG. 1 is small. In the meanwhile, for example, in a case of a type of holding the dummy wafer R from a lateral side, a threshold value of the warpage in the +Z direction in FIG. 1 is small.

FIG. 12 and FIG. 13 are schematic views of side cross sections each indicating a width of the warpage of the semiconductor wafer W. As shown in FIG. 12, when the semiconductor wafer W is warped in the +Z direction (the vertically upper side) from a center portion toward a lateral side, it is determined that the direction of the warpage is +. The value of the warpage information in this case is +t1. As shown in FIG. 13, when the semiconductor wafer W is warped in the −Z direction (the vertically lower side) from a center portion toward a lateral side, it is determined that the direction of the warpage is −. The value of the warpage information in this case is −t2.

Figure 15:
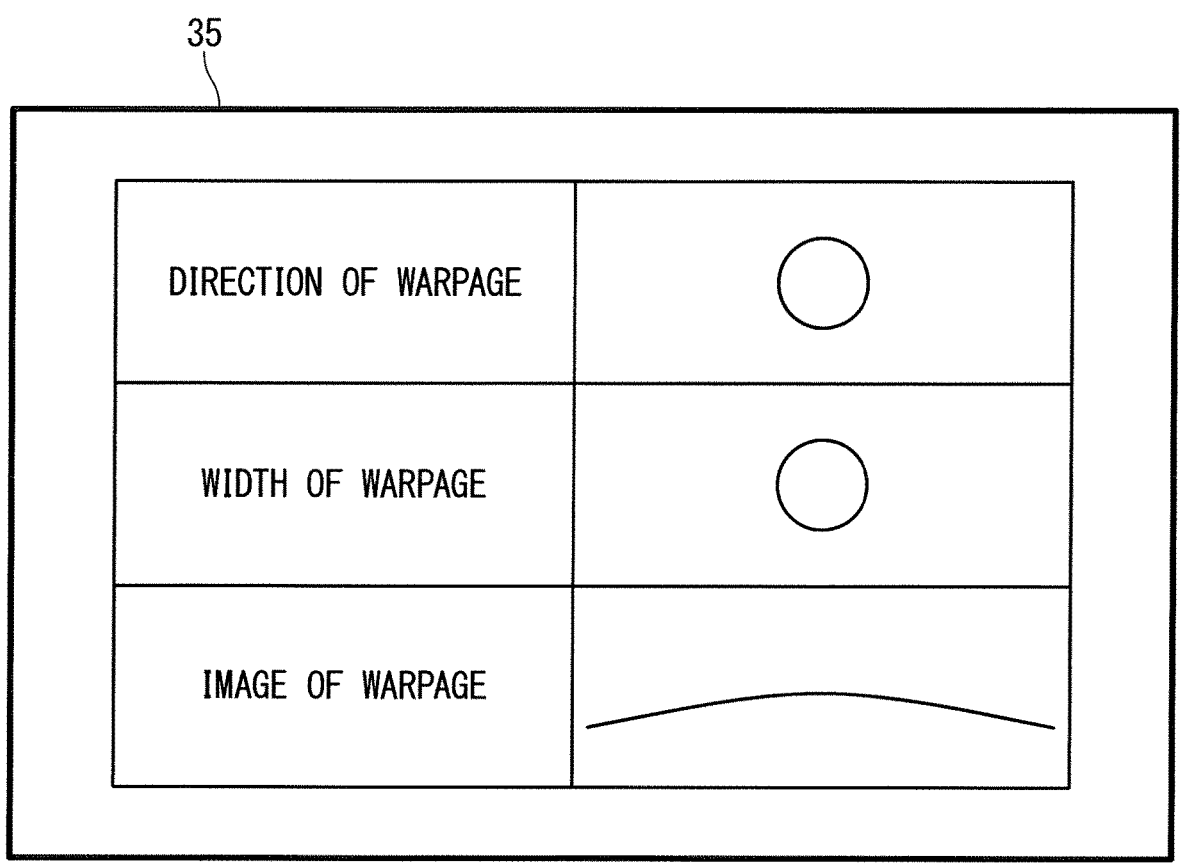
FIG. 15 is a screen displayed on a display part.

Each of FIG. 14 and FIG. 15 shows a screen displayed on the display part 35. As shown in FIG. 14, indicated for each wafer is information whether the value of the warpage information is within or beyond the range of the threshold value. In FIG. 14, the values of the warpage information of both the dummy wafer R in slot 1 and the dummy wafer R in slot 2 are within the threshold value, thus are indicated by a mark of ○. In the meanwhile, when the value of the warpage information is beyond the threshold value, it is indicated by a mark of X. As shown in FIG. 15, detailed warpage information may be displayed on the display part 35 for each dummy wafer R. For example, the display part 35 is a touch panel-type screen, and when a manager comes in contact with an α portion in FIG. 14, a screen shown in FIG. 15 is displayed. In FIG. 15, an image diagram of the warpage of the dummy wafer R is also displayed together. Accordingly, the manager can easily grasp a defect of the dummy wafer R.

When it is determined that the value of the warpage information detected in Step S3 is beyond the threshold value, the controller 3 determines that "the dummy wafer R cannot be used". In this case, the alarm activation part 32 activates an alarm as shown by a flow in FIG. 10 (Step S101). This alarm activation is indicated by a mark of X in FIG. 14, for example. Then, the controller 3 determines that "the dummy wafer R cannot be used", and the storage part 34 stores that the dummy wafer R is the non-usable dummy wafer R (Step S102). The dummy wafer R determined as the non-usable dummy wafer R in Step S102 in this manner is transported to the carrier CA for disposal (Step S103). In contrast, when the value of the warpage information is within the threshold value, the dummy wafer R proceeds to a subsequent treatment as scheduled. The subsequent treatment is damage detection processing, heating time calculation processing, number of heating treatments calculation processing, or a heat treatment, for example.

It is also applicable that the dummy wafer R is transported into the damage detection chamber 171 of the damage detection part 170 after the dummy wafer R is transported into the alignment part 230 and positioning of the dummy wafer R is performed. When the dummy wafer R is transported into the damage detection chamber 171, the damage detection device 173 in the damage detection chamber 171 detects a damage formed in the dummy wafer R (Step S4). Information of the detected damage of the dummy wafer R is input to the storage part 34 or the calculation part 31. The calculation part 31 calculates whether a value of the damage information of the dummy wafer R is within or beyond a range of a threshold value previously stored in the storage part 34 (Step S5).

The value of the damage information can be referred to as a damage amount. The value of the damage information is a depth of the damage, a length of the damage, and a width of the damage, for example. The value of the damage information is preferably a multiplication of the depth of the damage, the length of the damage, and the width of the damage. That is to say, a value E of the damage information is expressed by a depth of the damage (d)×a length of the damage (l)×a width of the damage (w). When one dummy wafer R includes a plurality of damages, the value of the damage information may be a sum of the value of each damage information of the plurality of damages. That is to say, the value of the damage information (E) may be expressed by a value EA of damage information of a damage A (a depth of a damage (dA)×a length of a damage (lA)×a width of a damage (wA))+a value EB of damage information of a damage B (a depth of a damage (dB)×a length of a damage (lB)×a width of a damage (wB))+a value EC of damage information of a damage C (a depth of a damage (dC)×a length of a damage (lC)×a width of a damage (wC). Weighting of the damage amount can be performed based on positional information of the damage in the value E of the damage information. A distance m from a center O of the dummy wafer R to the damage, for example, can be used as the positional information of the damage. The distance m from the center O to the damage is a distance from the center O to a center portion of the damage, or a distance from the center O to a position in the damage closest to the center O, for example. For example, the value of the damage information (E) is expressed by a depth of a damage (dA)×a length of a damage (lA)×a width of a damage (wA)/(a distance mA from the damage A to the center O)+a damage (dB)×a length of a damage (lB)×a width of a damage (wB)/(a distance mB from the damage B to the center O)+a depth of a damage (dC)×a length of a damage (lC)×a width of a damage (wC)/(a distance mC from the damage C to the center O).

As evidenced by the foregoing description, the references throughout to a "damage" to or in the dummy substrate refers to a type of "damage" that can be characterized by dimensional parameters thereof such as by the "length" and "width" and "depth" of the damage formed on the dummy substrate. Therefore, the term "damage" as used herein can also be referred to as being a "scratch" or the like in the dummy substate.

The reason that the value of the damage information includes the positional information of the damage is as follows. Generally, as a position of the damage gets closer to the center of the semiconductor wafer W (or the dummy wafer R), the semiconductor wafer W (or the dummy wafer R) tends to be broken more easily. Thus, a degree of influence on breakage of the semiconductor wafer W (or the dummy wafer R) differs between a damage close to the center and a damage on an end portion. Accordingly, it is preferable that weighting is performed on the value of the damage information by dividing "the distance m from the center O to the damage" on the value of the damage information.

Figure 16:
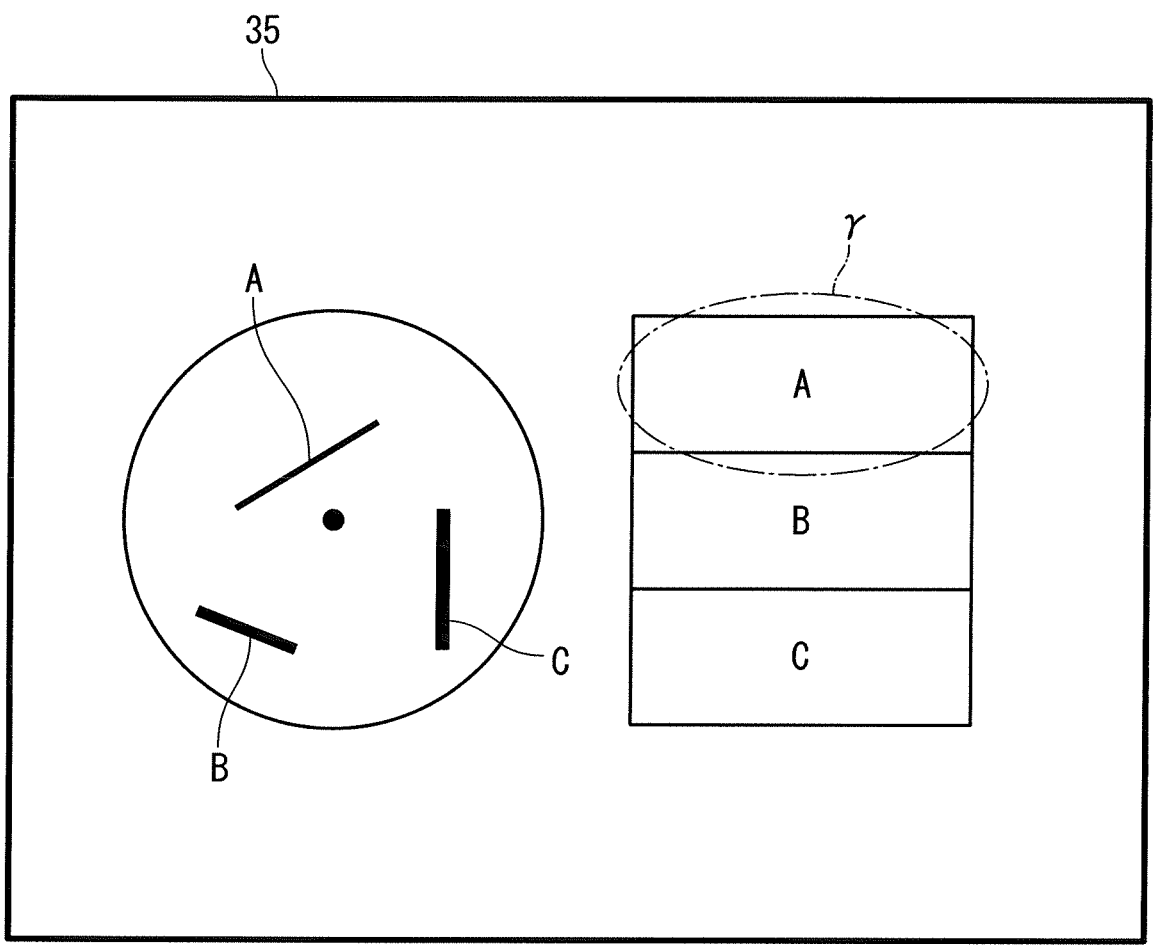
FIG. 16 is a screen displayed on a display part.
Figure 17:
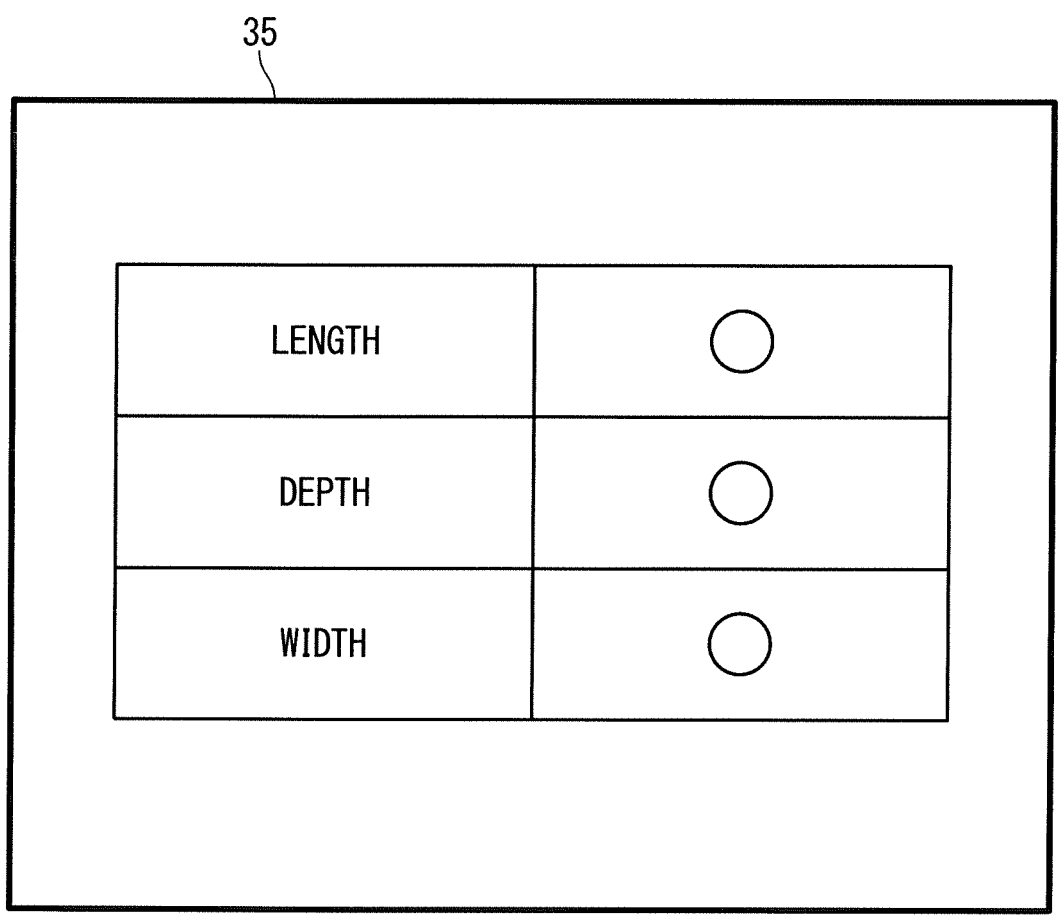
FIG. 17 is a screen displayed on a display part.

Each of FIG. 16 and FIG. 17 shows a screen displayed on the display part 35. With reference to FIG. 14 again, indicated for each wafer is information whether the value of the damage information is within or beyond the range of the threshold value. In FIG. 14, the value of the damage information of the dummy wafer R in slot 1 is within the threshold value, thus is indicated by a mark of ○. In the meanwhile, the value of the damage information of the dummy wafer R in slot 2 is beyond the threshold value, thus is indicated by a mark of X. As shown in FIG. 16, detailed damage information may be displayed on the display part 35 for each dummy wafer R. For example, the display part 35 is a touch panel-type screen, and when a manager comes in contact with a β portion in FIG. 14, a screen shown in FIG. 16 is displayed on the display part 35. In FIG. 16, an image diagram of the damage of the dummy wafer R is also displayed together. The manager can immediately grasp a position and a size of each damage by the image diagram as shown in FIG. 16. When the manager comes in contact with a γ portion in FIG. 16, a screen shown in FIG. 17 is displayed on the display part 35. Accordingly, the manager can easily grasp a defect of the dummy wafer R.

When it is determined that the value of the damage information detected in Step S5 is beyond the threshold value, the controller 3 determines that "the dummy wafer R cannot be used". In this case, the alarm activation part 32 activates an alarm as shown by a flow in FIG. 10 (Step S101). This alarm activation is indicated by a mark of x in FIG. 14, for example. Then, the controller 3 determines that "the dummy wafer R cannot be used", and the storage part 34 stores that the dummy wafer R is the non-usable dummy wafer R (Step S102). The dummy wafer R determined as the non-usable dummy wafer R in Step S102 in this manner is transported to the carrier CA for disposal (Step S103). In contrast, when the value of the damage information is within the threshold value, the dummy wafer R proceeds to a subsequent treatment as scheduled. The subsequent treatment is warpage detection processing, heating time calculation processing, number of heating treatments calculation processing, or a heat treatment, for example.

After the dummy wafer R is transported into the alignment part 230 and the positioning of the dummy wafer R is performed, the calculation part 31 calculates a total period of time of heating the dummy wafer R which has been performed up to this point to calculate whether a value of the total period of time of heating is within or beyond a threshold value previously stored in the storage part 34 (Step S6). Specifically, the total period of time of heating the dummy wafer R is obtained by adding all of the period of time for preheating using the halogen lamps HL in each time. For example, when a first heating, a second heating, and a third heating are performed for four seconds, five seconds, and three seconds, respectively, in the dummy wafer R on which preheating has been performed three times, a total period of time of heating is four seconds+five seconds+three seconds=twelve seconds. The calculation part 31 compares the total period of time of preheating and a threshold value previously stored in the storage part 23.

As shown in FIG. 14, indicated for each wafer is information whether the value of the total period of time of heating is within or beyond the range of the threshold value. In FIG. 14, both the values of the total period of time of heating the dummy wafer R in slot 1 and the dummy wafer R in slot 2 are within the threshold value, thus are indicated by a mark of ○. In the meanwhile, when the value of the total period of time of heating is beyond the threshold value, it is indicated by a mark of x. The manager can easily grasp a defect of the dummy wafer R by such a display.

When it is determined that the value of the total period of time of heating compared in Step S6 is beyond the threshold value, the controller 3 determines that "the dummy wafer R cannot be used". In this case, the alarm activation part 32 activates an alarm as shown by a flow in FIG. 10 (Step S101). This alarm activation is indicated by a mark of x in FIG. 14, for example. Then, the controller 3 determines that "the dummy wafer R cannot be used", and the storage part 34 stores that the dummy wafer R is the non-usable dummy wafer R (Step S102). The dummy wafer R determined as the non-usable dummy wafer R in Step S102 in this manner is transported to the carrier CA for disposal (Step S103). In contrast, when the value of the total period of time of heating is within the threshold value, the dummy wafer R proceeds to a subsequent treatment as scheduled. The subsequent treatment is warpage detection processing, damage detection processing, number of heating treatments calculation processing, or a heat treatment, for example.

After the dummy wafer R is transported into the alignment part 230 and the positioning of the dummy wafer R is performed, the calculation part 31 calculates the number of heating treatments on the dummy wafer R which has been performed up to this point to calculate whether a value of the number of heating treatments is within or beyond a threshold value previously stored in the storage part 34 (Step S7). Specifically, the number of heating treatments on the dummy wafer R is the number of flash irradiations which have been performed using the flash lamps FL. For example, in a case of the dummy wafer R on which the flash heating has been performed three times, the number of heating treatments is three. The calculation part 31 compares the number of heating treatments and a threshold value previously stored in the storage part 34.

As shown in FIG. 14, indicated for each wafer is information whether the value of the number of heating treatments is within or beyond the range of the threshold value. In FIG. 14, both the values of the number of heating treatments on the dummy wafer R in slot 1 and the dummy wafer R in slot 2 are within the threshold value, thus are indicated by a mark of ○. In the meanwhile, when the value of the number of heating treatments is beyond the threshold value, it is indicated by a mark of x. The manager can easily grasp a defect of the dummy wafer R by such a display.

When it is determined that the value of the number of heating treatments compared in Step S6 is beyond the threshold value, the controller 3 determines that "the dummy wafer R cannot be used". In this case, the alarm activation part 32 activates an alarm as shown by a flow in FIG. 10 (Step S101). This alarm activation is indicated by a mark of x in FIG. 14, for example. Then, the controller 3 determines that "the dummy wafer R cannot be used", and the storage part 34 stores that the dummy wafer R is the non-usable dummy wafer R (Step S102). The dummy wafer R determined as the non-usable dummy wafer R in Step S102 in this manner is transported to the carrier CA for disposal (Step S103). In contrast, when the value of the number of heating treatments is within the threshold value, the dummy wafer R proceeds to a subsequent treatment as scheduled. The subsequent treatment is warpage detection processing, damage detection processing, heating time calculation processing, or a heat treatment, for example.

All of the warpage detection processing in Step S2 and Step S3, the damage detection processing in Step S4 and Step S5, the heating time calculation processing in Step S6, and the number of heating treatments calculation processing in Step S7 described above may be performed. At least one of the warpage detection processing and the damage detection processing or both of them are performed. Accordingly, deterioration of the dummy wafer R can be managed in detail. According to such a configuration, the warpage or the damage of the dummy wafer R caused by the transportation processing or the heating treatment performed several times can be detected before the heating treatment. If the transportation processing or the heating treatment is performed on the dummy wafer R having a defect such as the warpage or the damage, a failure in transportation or breakage of the dummy wafer R in a transportation route or the heat treatment chamber 161 may occur. The warpage or the damage of the dummy wafer R is detected before the heating treatment, thus a defect of the dummy wafer R can be previously grasped. Then, a subsequent heat treatment is not performed, thus breakage caused by such a defect can be prevented before it occurs.

It can also be determined whether or not the dummy wafer R can be used based on a period of time for which the dummy wafer R is heated by irradiation with light from the halogen lamps HL. Accordingly, breakage of the dummy wafer R caused by a defect which does not appear in the warpage information or the damage information can be prevented before it occurs. It can also be determined whether or not the dummy wafer R can be used based on the number of flash irradiations from the flash lamps FL. Accordingly, breakage of the dummy wafer R caused by a defect which does not appear in the warpage information or the damage information can be prevented before it occurs.

After the state of the dummy wafer R described above is detected, the heating treatment is performed on the dummy wafer R being within a range of the threshold value (Step S8). Firstly, the transport robot 150 having taken out the dummy wafer R turns to face toward the heat treatment part 160 when the heating treatment in Step S8 is performed. Subsequently, the gate valve 162 opens a portion between the heat treatment chamber 161 and the transport chamber 151, and the transport robot 150 transports the untreated dummy wafer R into the heat treatment chamber 161. At this time, if the preceding dummy wafer R on which the heating treatment has been performed is in the heat treatment chamber 161, one of the two transport hands 152 takes out the dummy wafer R on which the heating treatment has been performed and then the other one thereof transports the untreated dummy wafer R into the heat treatment chamber 161, whereby the wafers are replaced. Subsequently, the gate valve 162 closes the portion between the heat treatment chamber 161 and the transport chamber 151.

The dummy wafer R transported into the heat treatment chamber 161 is preheated by the halogen lamps HL, and then is subjected to the flash heat treatment by flash irradiation from the flash lamps FL.

After the flash heat treatment is finished, the gate valve 162 opens the portion between the heat treatment chamber 161 and the transport chamber 151, and the transport robot 150 transports the dummy wafer R on which the flash heat treatment has been performed from the heat treatment chamber 161 to the transport chamber 151. The transport robot 150 having taken out the dummy wafer R turns to face toward the first cooling chamber 131 or the second cooling chamber 141 from the heat treatment chamber 161. The gate valve 162 closes the portion between the heat treatment chamber 161 and the transport chamber 151.

Subsequently, the transport robot 150 transports the dummy wafer R on which the heating treatment has been performed into the first cooling chamber 131 of the cooling part 130 or the second cooling chamber 141 of the cooling part 140. The first cooling chamber 131 or the second cooling chamber 141 performs a cooling treatment on the dummy wafer R on which the flash heat treatment has been performed (Step S9). At a point in time when the dummy wafer R is transported out of the heat treatment chamber 161 of the heat treatment part 160, the temperature of the entire dummy wafer R is relatively high, and therefore is cooled to approximately a room temperature by the first cooling chamber 131 or the second cooling chamber 141.

After a predetermined cooling treatment time passes, the transport robot 150 transports the cooled dummy wafer R out of the first cooling chamber 131 or the second cooling chamber 141, and warpage detection processing, damage detection processing, heating time calculation processing, or number of heating treatments calculation processing is performed again in the manner similar to Step S2 to Step S7 before the heating treatment.

Specifically, the dummy wafer R is transported into the alignment part 230, and warpage of the dummy wafer R is optically detected (Step S10). Information of the detected warpage of the dummy wafer R is input to the storage part 34 and the calculation part 31. The calculation part 31 calculates whether a value of the warpage information of the dummy wafer R is within or beyond a range of a threshold value previously stored in the storage part 34 (Step S11).

When it is determined that the value of the warpage information detected in Step S11 is beyond the threshold value, the controller 3 determines that "the dummy wafer R cannot be used". In this case, the alarm activation part 32 activates an alarm as shown by a flow in FIG. 11 (Step S201). This alarm activation is indicated by a mark of x in FIG. 14. Then, the controller 3 determines that "the dummy wafer R cannot be used", and the storage part 34 stores that the dummy wafer R is the non-usable dummy wafer R (Step S201). The dummy wafer R determined as the non-usable dummy wafer R in Step S202 in this manner is transported to the carrier CA for disposal (Step S203). In contrast, when the value of the warpage information is within the threshold value, the dummy wafer R proceeds to a subsequent treatment as scheduled. The subsequent treatment is damage detection processing, heating time calculation processing, or number of heating treatments calculation processing, for example. When there is no subsequent treatment, the dummy wafer R is returned to the carrier CA.

The dummy wafer R may be transported into the damage detection chamber 171 of the damage detection part 170. When the dummy wafer R is transported into the damage detection chamber 171, the damage detection device 173 in the damage detection chamber 171 detects a damage formed in the dummy wafer R (Step S12). Information of the detected damage of the dummy wafer R is input to the storage part 34 or the calculation part 31. The calculation part 31 calculates whether a value of the damage information of the dummy wafer R is within or beyond a range of a threshold value previously stored in the storage part 34 (Step S13).

The manager can immediately grasp a position and a size of each damage by the image diagram as shown in FIG. 16. When the manager comes in contact with a γ portion in FIG. 16, a screen shown in FIG. 17 is displayed on the display part 35. Accordingly, the manager can easily grasp a defect of the dummy wafer R.

When it is determined that the value of the damage information detected in Step S13 is beyond the threshold value, the controller 3 determines that "the dummy wafer R cannot be used". In this case, the alarm activation part 32 activates an alarm as shown by a flow in FIG. 10 (Step S201). This alarm activation is indicated by a mark of x in FIG. 14, for example. Then, the controller 3 determines that "the dummy wafer R cannot be used", and the storage part 34 stores that the dummy wafer R is the non-usable dummy wafer R (Step S202). The dummy wafer R determined as the non-usable dummy wafer R in Step S202 in this manner is transported to the carrier CA for disposal (Step S203). In contrast, when the value of the damage information is within the threshold value, the dummy wafer R proceeds to a subsequent treatment as scheduled. The subsequent treatment is warpage detection processing, heating time calculation processing, number of heating treatments calculation processing, or a heat treatment, for example. When there is no subsequent treatment, the dummy wafer R is returned to the carrier CA.

The calculation part 31 calculates a total period of time of heating the dummy wafer R which has been performed up to this point (Step S14). The calculation part 31 calculates whether a value of the total period of time of heating the dummy wafer R is within or beyond a range of a threshold value previously stored in the storage part 34 (Step S15).

When it is determined that the value of the total period of time of heating calculated in Step S15 is beyond the threshold value, the controller 3 determines that "the dummy wafer R cannot be used". In this case, the alarm activation part 32 activates an alarm as shown by a flow in FIG. 11 (Step S201). This alarm activation is indicated by a mark of x in FIG. 14, for example. Then, the controller 3 determines that "the dummy wafer R cannot be used", and the storage part 34 stores that the dummy wafer R is the non-usable dummy wafer R (Step S202). The dummy wafer R determined as the non-usable dummy wafer R in Step S202 in this manner is transported to the carrier CA for disposal (Step S203). In contrast, when the value of the total period of time of heating is within the threshold value, the dummy wafer R proceeds to a subsequent treatment as scheduled. The subsequent treatment is warpage detection processing, damage detection processing, number of heating treatments calculation processing, or a heat treatment, for example. When there is no subsequent treatment, the dummy wafer R is returned to the carrier CA.

The calculation part 31 calculates the number of heating treatments on the dummy wafer R (Step S16). That is to say, the calculation part 31 adds the number of heating treatments performed on the dummy wafer R this time. The calculation part 31 calculates whether a value of the number of heating treatments on the dummy wafer R is within or beyond a range of a threshold value previously stored in the storage part 34 (Step S17).

When it is determined that the value of the number of heating treatments calculated in Step S17 is beyond the threshold value, the controller 3 determines that "the dummy wafer R cannot be used". In this case, the alarm activation part 32 activates an alarm as shown by a flow in FIG. 11 (Step S201). This alarm activation is indicated by a mark of x in FIG. 14, for example. Then, the controller 3 determines that "the dummy wafer R cannot be used", and the storage part 34 stores that the dummy wafer R is the non-usable dummy wafer R (Step S202). The dummy wafer R determined as the non-usable dummy wafer R in Step S202 in this manner is transported to the carrier CA for disposal (Step S203). In contrast, when the value of the number of heating treatments is within the threshold value, the dummy wafer R proceeds to a subsequent treatment as scheduled. The subsequent treatment is warpage detection processing, damage detection processing, number of heating treatments calculation processing, or a heat treatment, for example. When there is no subsequent treatment, the dummy wafer R is returned to the carrier CA.

After the carrier CA houses a predetermined number of treated semiconductor wafers W, this carrier CA is transported out of the load port 110 of the indexer 101.

All of the warpage detection processing in Step S10 and Step S11, the damage detection processing in Step S12 and Step S13, the heating time calculation processing in Step S14 and Step S15, and the number of heating treatments calculation processing in Step S16 and Step S17 described above may be performed. At least one of the warpage detection processing, and the damage detection processing, or both of them are performed. Accordingly, deterioration of the dummy wafer R can be managed in detail. According to such a configuration, the warpage or the damage of the dummy wafer R caused by the transportation processing or the heating treatment performed several times can also be detected after the heating treatment. Accordingly, the dummy wafer R whose value is within the threshold value before the heating treatment but is beyond the threshold value after the heating treatment can be treated as the non-usable dummy wafer R so that the next transportation and the other treatment thereof are not performed.

OTHER CONFIGURATION

In the embodiment described above, multiplication of the direction of the warpage and the width of the warpage is described as the value of the warpage information, however, the configuration is not limited thereto. The type of holding the semiconductor wafer W from a lower side has a problem that the semiconductor wafer W is hardly held only in a case where the direction of warpage is −direction as illustrated in FIG. 12. In the meanwhile, the type of holding the semiconductor wafer W from a lateral side has a problem that the semiconductor wafer W is hardly held only in a case where the direction of warpage is +direction as illustrated in FIG. 13. Accordingly, the warpage information may only include information of a direction of warpage. In this case, the type of holding the semiconductor wafer W (or the dummy wafer R) from the lower side determines that the dummy wafer R cannot be used when the direction of the warpage is −direction. In the meanwhile, the type of holding the semiconductor wafer W (or the dummy wafer R) from the lateral side determines that the dummy wafer R cannot be used when the direction of the warpage is +direction.

The value of the damage information is expressed by the depth of the damage, the length of the damage, and the width of the damage in the embodiment described above, but is not limited thereto. Information of only the number of damages may also be applicable. Described as the example of the value of the damage information is the multiplication of the depth of the damage, the length of the damage, and the width of the damage, but is not limited thereto. Also applicable is at least one of the depth of the damage, the length of the damage, and the width of the damage, and a multiplication of two of them is also applicable.

In the embodiment described above, the mark of X is set to be displayed as the alarm from the alarm activation part, but is not limited thereto. Different colors may be displayed as an alarm from the alarm activation part. For example, it is applicable that blue color is displayed when the value is within the range of the threshold value, and red color is displayed when the value is beyond the range of the threshold value to make a manager grasp the state of the dummy wafer. An alarm sound may be activated when the value is beyond the range of the threshold value.

In the embodiment described above, the warpage or the damage of the dummy wafer R is detected before and after the heating treatment on the dummy wafer R, however, the configuration is not limited thereto. The warpage or the damage may be detected only before the heating treatment on the dummy wafer R. When the warpage or the damage can be detected before the heating treatment on the dummy wafer R, breakage of the dummy wafer R in a transportation route or the heat treatment chamber 161 can be prevented before it occurs. Accordingly, a defect of a component in a transportation route or the heat treatment chamber 161 can also be prevented before it occurs.

In the first embodiment described above, the filament-type halogen lamps HL are used as continuous lighting lamps that emit light continuously for not less than one second to preheat the semiconductor wafer W. The present invention, however, is not limited thereto. In place of the halogen lamps HL, discharge type arc lamps (e.g., xenon arc lamps) or LED lamps may be used as continuous lighting lamps to perform the preheating.

Moreover, a substrate to be treated by the heat treatment apparatus 100 is not limited to a semiconductor wafer, but may be a glass substrate for use in a flat panel display for a liquid crystal display apparatus and the like, and a substrate for a solar cell.

While the invention has been shown and described in detail, the foregoing description is in all aspects illustrative and not restrictive. It is therefore understood that numerous modifications and variations can be devised without departing from the scope of the invention.

What is claimed is:

1. A heat treatment apparatus managing a dummy wafer, comprising:
    a heat treatment part performing a heat treatment on the dummy wafer;
    a scratch detection part detecting a scratch of the dummy wafer, the scratch detection part including an inspection camera; and
    a controller determining whether or not the dummy wafer can be used based on scratch information detected by the scratch detection part,
    wherein the scratch information includes a depth of the scratch, a length of the scratch, a width of the scratch, and positional information of the scratch,
    the controller calculates a scratch amount E from a formula: $E=(d \cdot l \cdot w)/m$, in which d denotes the depth of the scratch, l denotes the length of the scratch, w denotes the width of the scratch, and m denotes a distance from a center of the dummy wafer to the scratch, and
    the controller determines that the dummy wafer cannot be used when the scratch amount is beyond a predetermined threshold value.

2. The heat treatment apparatus according to claim 1, wherein
    the controller further determines whether or not the dummy wafer can be used based on a total number of flash heat treatments performed by flash lamps.

3. The heat treatment apparatus according to claim 1, wherein
    the controller further determines whether or not the dummy wafer can be used based on a heating time for which the dummy wafer is heated by irradiation with light from continuous lighting lamps.

* * * * *